(12) United States Patent
Lee et al.

(10) Patent No.: US 12,464,947 B2
(45) Date of Patent: Nov. 4, 2025

(54) WHITE ORGANIC LIGHT-EMITTING DEVICE AND DISPLAY DEVICE USING THE SAME

(71) Applicant: LG Display Co., Ltd., Seoul (KR)

(72) Inventors: Yu Jeong Lee, Seoul (KR); Wook Song, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 1000 days.

(21) Appl. No.: 17/546,396

(22) Filed: Dec. 9, 2021

(65) Prior Publication Data

US 2022/0209138 A1 Jun. 30, 2022

(30) Foreign Application Priority Data

Dec. 31, 2020 (KR) .................. 10-2020-0190047

(51) Int. Cl.
*H10K 50/11* (2023.01)
*H10K 50/12* (2023.01)
*H10K 85/60* (2023.01)
*H10K 101/10* (2023.01)
*H10K 101/30* (2023.01)
*H10K 101/40* (2023.01)

(52) U.S. Cl.
CPC ....... *H10K 85/6574* (2023.02); *H10K 85/622* (2023.02); *H10K 85/624* (2023.02);
(Continued)

(58) Field of Classification Search
CPC ............. H10K 85/6574; H10K 85/622; H10K 85/624; H10K 85/6576; H10K 50/11;
(Continued)

(56) References Cited

U.S. PATENT DOCUMENTS

2006/0017368 A1* 1/2006 Bae ................ H01J 63/04
313/491
2008/0118724 A1* 5/2008 Cina .................. H10K 50/155
428/213
(Continued)

FOREIGN PATENT DOCUMENTS

KR 10-2018-0001826 A 1/2018
KR 10-2018-0078637 A 7/2018
(Continued)

OTHER PUBLICATIONS

Office Action issued on Mar. 24, 2025 in Chinese Patent Application No. 202111590250.1 with English translation.

*Primary Examiner* — William B Partridge
*Assistant Examiner* — Erik A. Anderson
(74) *Attorney, Agent, or Firm* — Morgan, Lewis & Bockius LLP

(57) ABSTRACT

A white organic light-emitting device including a first electrode, a second electrode, the second electrode and the first electrode facing each other, a blue light-emitting stack, a phosphorescent light-emitting stack including a hole transport layer, an electron transport layer, a red light-emitting layer, and a green light-emitting layer that includes a hole-transporting host, an electron-transporting host, a first dopant having a green emission peak, and a non-emissive second dopant, where the blue light-emitting stack and the phosphorescent light-emitting stack are between the first electrode and the second electrode, and a charge generation layer interposed between the blue light-emitting stack and the phosphorescent light-emitting stack.

18 Claims, 14 Drawing Sheets

(52) U.S. Cl.
CPC ......... *H10K 85/6576* (2023.02); *H10K 50/11* (2023.02); *H10K 50/121* (2023.02); *H10K 2101/10* (2023.02); *H10K 2101/30* (2023.02); *H10K 2101/40* (2023.02)

(58) Field of Classification Search
CPC ............. H10K 50/121; H10K 2101/10; H10K 2101/30; H10K 2101/40; H10K 50/12; H10K 50/131; H10K 59/12; H10K 50/13; H10K 50/19; H10K 2101/00
See application file for complete search history.

(56) References Cited

U.S. PATENT DOCUMENTS

| | | | | |
|---|---|---|---|---|
| 2014/0197389 A1* | 7/2014 | Adamovich | ........... | H10K 50/15 257/40 |
| 2015/0171359 A1* | 6/2015 | Forrest | ........... | H10K 50/17 257/40 |
| 2015/0287948 A1* | 10/2015 | Fukase | ........... | H10K 50/131 257/40 |
| 2016/0164003 A1* | 6/2016 | Kim | ........... | H10K 85/615 540/543 |
| 2017/0179418 A1* | 6/2017 | Lee | ........... | H10K 50/84 |
| 2018/0033994 A1* | 2/2018 | Jang | ........... | H10K 50/11 |
| 2018/0170914 A1 | 6/2018 | Miyata et al. | | |
| 2019/0372022 A1* | 12/2019 | Yoon | ........... | H10K 85/6572 |
| 2020/0106026 A1 | 4/2020 | Kang et al. | | |
| 2020/0194691 A1* | 6/2020 | Nguyen | ........... | H10K 85/342 |
| 2022/0059776 A1* | 2/2022 | Wang | ........... | H10K 85/40 |
| 2022/0149293 A1* | 5/2022 | Kim | ........... | H10K 85/657 |

FOREIGN PATENT DOCUMENTS

| | | |
|---|---|---|
| KR | 10-2019-0024398 A | 3/2019 |
| KR | 10-2020-0038061 A | 4/2020 |
| KR | 10-2020-0083422 A | 7/2020 |
| KR | 10-2146446 B1 | 8/2020 |

* cited by examiner

WHITE ORGANIC LIGHT-EMITTING DEVICE AND DISPLAY DEVICE USING THE SAME

CROSS-REFERENCE TO RELATED APPLICATION

This application claims the benefit of and the priority to Korean Patent Application No. 10-2020-0190047, filed on Dec. 31, 2020, which is hereby incorporated by reference in its entirety as if fully set forth herein.

BACKGROUND

1. Technical Field

The present disclosure relates to a light-emitting device and a display device using the same. The light-emitting device may be a white organic light-emitting device, which may be capable of preventing color inversion at a low-current density by modifying the configurations of heterogeneous light-emitting layers that may be in contact with each other.

2. Description of the Related Art

An organic light-emitting display device may include a plurality of sub-pixels and an organic light-emitting element provided in each of the sub-pixels. Therefore, the device may emit light without a separate light source. Recently, organic light-emitting display devices are becoming more attractive because they do not require a separate light source and enable realization of a compact device design and vivid color display.

A tandem device, in which an organic layer and a light-emitting layer are formed in the configuration of an organic light-emitting device without a deposition mask, has recently received increased attention in terms of processability. Research on such devices is currently being conducted.

SUMMARY

In a stack having heterogeneous light-emitting layers in a tandem device including a plurality of light-emitting layers, light emission may need to occur at the interface between the light-emitting layers in the stack to make the light-emitting layers completely emit light in the single stack. However, because the material of a red light-emitting layer and the material of a green light-emitting layer are different from each other, it may be difficult to adjust an emission zone. Accordingly, a current density may vary and may cause a color inversion phenomenon in which a green color may be strongly expressed.

Further, in the case in which a green light-emitting layer, which contributes the most to the brightness of a white color, may be designed to have relatively high luminous efficiency, a tail of the emission zone may be generated adjacent to an electron transport layer. Therefore, electrons may accumulate at the interface between the electron transport layer and the green light-emitting layer and may shorten the lifespan of a product.

Accordingly, the present disclosure is directed to a white organic light-emitting display and a display device using the same, both of which substantially obviate one or more problems due to the limitations and disadvantages of the related art.

An aspect of the present disclosure is to provide a white organic light-emitting device and a display device including the same. Both devices may contain a non-emissive dopant in a green light-emitting layer. Therefore, efficiency may be improved, color inversion at a low-current density may be prevented or reduced, and the lifespan may be lengthened.

In addition to the aspect of the present disclosure as mentioned above, additional advantages, objects, and features of the disclosure will be clearly understood by those skilled in the art from the following description of the disclosure. The objectives and other advantages of the disclosure may be realized and attained by the structure particularly pointed out in the written description and claims hereof as well as the appended drawings.

To achieve the above objects and other advantages in accordance with the purpose of the present disclosure, as embodied and broadly described herein, a white organic light-emitting device may include a first electrode, a second electrode, the second electrode and the first electrode may face each other, a blue light-emitting stack, a phosphorescent light-emitting stack that may include a hole transport layer, an electron transport layer, a red light-emitting layer, a green light-emitting layer that may include a hole-transporting host, an electron-transporting host, a first dopant having a green emission peak, and a non-emissive second dopant. The blue light-emitting stack and the phosphorescent light-emitting stack may be between the first electrode and the second electrode, with a charge generation layer interposed between the blue light-emitting stack and the phosphorescent light-emitting stack.

In some example embodiments, a difference, $\Delta$Est, between a singlet energy level of the second dopant and a triplet energy level of the second dopant may be 0.6 eV or more.

In some example embodiments, a singlet energy level of the second dopant may be greater than a singlet energy level of each of the hole-transporting host, the electron-transporting host, and the first dopant. The singlet energy level of each of the hole-transporting host and the electron-transporting host may be 2.7 eV or more.

In some example embodiments, a triplet energy level of the second dopant may be less than a triplet energy level of each of the hole-transporting host and the electron-transporting host, and may be greater than a triplet energy level of the first dopant. The triplet energy level of the first dopant may be 2.4 eV or more.

In some example embodiments, the second dopant may have an emission peak at a wavelength of 400 nm or less.

In some example embodiments, a highest occupied molecular orbital, HOMO, energy level of the second dopant may be lower than a HOMO energy level of the electron-transporting host. A lowest unoccupied molecular orbital, LUMO, energy level of the second dopant may be higher than a LUMO energy level of the first dopant.

In some example embodiments, the second dopant may have an energy band gap of 3 eV or more and a HOMO energy level of −6.0 eV or less.

In some example embodiments, an electron mobility of the second dopant may be higher than a hole mobility of the second dopant.

In some example embodiments, the first dopant and the second dopant may be present in the green light-emitting layer in a total amount of from 0.02 vol % to 30 vol %, based on a total volume of the hole-transporting host and the electron-transporting host. The second dopant may be present in the green light-emitting layer in an amount of from 0.01 vol % to 20 vol %, based on the total volume of the hole-transporting host and the electron-transporting host.

In some example embodiments, the blue light-emitting stack may include a first blue light-emitting stack and a second blue light-emitting stack between the first electrode and the second electrode.

In some example embodiments, the first and second blue light-emitting stacks may be disposed adjacent to the first electrode or the second electrode. Or, the phosphorescent light-emitting stack may be disposed the first blue light-emitting stack and the second blue light-emitting stack, a first charge generation layer may be interposed between the phosphorescent light-emitting stack and the first blue light-emitting stack, and a second charge generation layer may be interposed between the phosphorescent light-emitting stack and the second blue light-emitting stack.

In some example embodiments, the red light-emitting layer may have an emission peak at a wavelength of from 600 nm to 640 nm. The green light-emitting layer may have an emission peak at a wavelength of from 500 nm to 540 nm.

In some example embodiments, the red light-emitting layer may have an emission peak at a wavelength of from 600 nm to 640 nm. The green light-emitting layer may have an emission peak at a wavelength of from 540 nm to 580 nm.

In another aspect of the present disclosure, a display device according to an example embodiment of the present disclosure may include a substrate including a thin-film transistor provided in each of sub-pixels, a first electrode connected to the thin-film transistor in each of the sub-pixels, a second electrode over the sub-pixels and spaced apart from the first electrode, a blue light-emitting stack, a phosphorescent light-emitting stack that may include a hole transport layer, an electron transport layer, a red light-emitting layer, and a green light-emitting layer that may include a hole-transporting host, an electron-transporting host, a first dopant having a green emission peak, and a non-emissive second dopant. The blue light-emitting stack and the phosphorescent light-emitting stack may be between the first electrode and the second electrode, and a charge generation layer may be interposed between the blue light-emitting stack and the phosphorescent light-emitting stack.

In some example embodiments, a difference, $\Delta Est$, between a singlet energy level of the second dopant and a triplet energy level of the second dopant may be 0.6 eV or more.

In some example embodiments, a singlet energy level of the second dopant may be greater than a singlet energy level of each of the hole-transporting host, the electron-transporting host, and the first dopant. The singlet energy level of each of the hole-transporting host and the electron-transporting host may be 2.7 eV or more.

In some example embodiments, a triplet energy level of the second dopant may be less than a triplet energy level of each of the hole-transporting host and the electron-transporting host, and may be greater than a triplet energy level of the first dopant. The triplet energy level of the first dopant may be 2.4 eV or more.

In some example embodiments, the second dopant may have an emission peak at a wavelength of 400 nm or less.

In some example embodiments, a HOMO energy level of the second dopant may be lower than a HOMO energy level of the electron-transporting host. A LUMO energy level of the second dopant may be higher than a LUMO energy level of the first dopant.

In some example embodiments, the second dopant may have an energy band gap of 3 eV or more and a HOMO energy level of −6.0 eV or less.

BRIEF DESCRIPTION OF THE DRAWINGS

The accompanying drawings, which are included to provide a further understanding of the disclosure and are incorporated in and constitute a part of this application, illustrate example embodiment(s) of the disclosure and together with the description serve to explain the principle of the disclosure. In the drawings.

DETAILED DESCRIPTION

Figure 1:
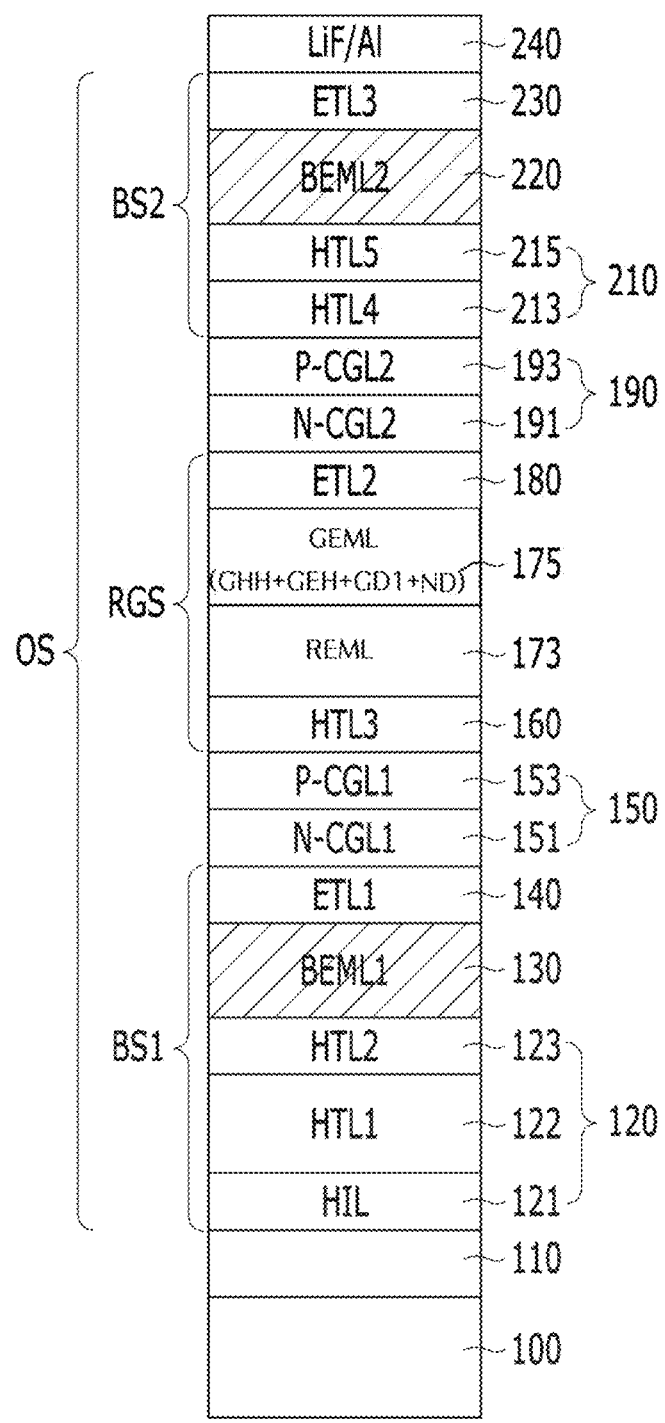
FIG. 1 is a cross-sectional view showing a white organic light-emitting device according to an example embodiment of the present disclosure.

Reference will now be made in detail to the embodiments of the present disclosure, examples of which are illustrated in the accompanying drawings. Advantages and features of the present disclosure, and implementation methods thereof will be clarified through following example embodiments described with reference to the accompanying drawings. However, the present disclosure may be embodied in different forms and should not be construed as limited to the example embodiments set forth herein. Rather, these example embodiments of the present disclosure are provided so that this disclosure may be sufficiently thorough and complete to assist those skilled in the art to fully understand the scope of the disclosure. Further, the protected scope of the present disclosure is defined by claims and their equivalents.

In the following description of the example embodiments and the drawings, the same or similar elements are denoted by the same reference numerals even though they are depicted in different drawings. Wherever possible, the same reference numbers will be used throughout the drawings to refer to the same or like parts. The same or similar elements are designated by the same reference numerals throughout the specification unless otherwise specified.

In the following description, where the detailed description of the relevant known functions and configurations may unnecessarily obscure an important point of the present disclosure, a detailed description of such known functions or configurations may be omitted. In addition, in the following description, the names of the elements are selected for ease of explanation and may be different from actual names.

The shapes, sizes, ratios, rates, angles, numbers, and the like, which are illustrated in the drawings to describe various example embodiments of the present disclosure, are merely given by way of example. Therefore, the present disclosure is not limited to the illustrations in the drawings.

In the present specification, the terms "including," "having," and the like, will be interpreted as one or more other characteristics, numbers, steps, operations, elements or parts may be added, and do not exclude other characteristics, numbers, steps, operations, elements, parts or combinations thereof, or possibility of adding the same. An element described in the singular form is intended to include a plurality of elements, and vice versa, unless the context clearly indicates otherwise.

In interpreting an element in the various example embodiments of the present disclosure, the element is to be construed as including an error or tolerance range even where no explicit description of such an error or tolerance range is provided.

In the following description of the various embodiments, it should be understood that, where positional relations are described, for example, where an element is "on," "above," "under," "beside," and the like, another element, one or more other elements may be located between the two elements unless a more limiting term, such as "immediate(ly)," "direct(ly)," or "close(ly)" is used. For example, where an element or layer is disposed "on" another element or layer, a third layer or element may be interposed therebetween.

In the following description of the various embodiments, it should be understood that, when temporal relations are described, for example, the term expressing a sequence of events, such as "after," "subsequent to," "next to," or "before," a case which is not continuous may be included unless a more limiting term, such as "just," "immediate(ly)," or "direct(ly)," is used.

In the following description of the various embodiments, it should be understood that, where the terms "first," "second", and the like, are used to describe various elements, these terms are used merely to distinguish the same or similar elements. These elements should not be limited by these terms as they are not used to define a particular order. For example, a first element described hereinafter could be termed a second element, and vice versa, without departing from the scope of the disclosure.

The term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Features of the various embodiments of the present disclosure may be partially or wholly coupled to or combined with each other, and may be variously inter-operated with each other and driven technically and interlocked with each other as those skilled in the art can sufficiently understand. Embodiments of the present disclosure may be carried out independently from each other, or may be carried out together in a co-dependent relationship.

In the following description of the various embodiments, the "lowest unoccupied molecular orbital (LUMO) energy level" and the "highest occupied molecular orbital (HOMO) energy level" of any layer may refer to the LUMO energy level and the HOMO energy level, respectively, of the material that may make up the larger or largest weight percentage of the corresponding layer, for example, a host material, except when the energy levels are described as the LUMO energy level and the HOMO energy level of a dopant material that may be doped in the corresponding layer.

In the following description of the various embodiments, the "HOMO energy level" may be obtained by measuring the energy required for electrons to be released from a surface of the layer by radiating ultraviolet (UV) light thereto. For example, the "HOMO energy level" may be obtained by measuring photoelectron release using an electrometer and calculating a threshold value of the photoelectron release from an irradiation photon energy curve of the obtained photoelectron release using extrapolation.

In the following description of the various embodiments, an energy band gap Eg may be obtained by measuring a UV absorption spectrum of the layer, drawing a tangent to a rising edge of a long wavelength of the absorption spectrum, and converting a wavelength at an intersection with the horizontal axis into an energy value ($E=h\nu/\lambda=h*C/\lambda$, where h is Planck's constant, C is the speed of light, and $\lambda$ is the wavelength of light).

In the following description of the various embodiments, a "doped" layer refers to a layer containing a host material and a dopant material that has properties different from the host material. Examples of host and dopant materials may include an N-type material and a P-type material or an organic material and an inorganic material. Apart from the differences in properties, the host and dopant materials may also differ in terms of their amounts in the doped layer. For example, the host material may be a major component while the dopant material may be a minor component. In some embodiments, an amount of dopant material is less than 30 wt %, based on a total weight of the doped layer.

In some embodiments, a layer may be made from organic materials only, which may include N-type and P-type materials. When the amount of the N-type material is less than 30 wt % or the content of the P-type material is less than 30 wt %, the layer may be a "doped" layer.

The term "undoped" describes layers that are not "doped." For example, a layer may be an "undoped" layer when it is formed of a single material or a mix of materials having the same or similar properties. As a further example, a layer may be an "undoped" layer when at least one of materials forming a layer is P-type and none of the materials forming the layer is N-type. As another example, a layer may be an "undoped" layer when at least one of the materials forming a layer is organic and none of the materials forming the layer is inorganic.

In the following description of the various embodiments, an electroluminescence (EL) spectrum may be obtained by multiplying (1) a photoluminescence (PL) spectrum, which shows the unique characteristics of an emissive material such as a dopant material or a host material included in an organic emission layer with (2) an outcoupling or emittance spectrum curve, which may be determined by the structure and optical characteristics of an organic light-emitting element. These characteristics include, for example, thicknesses of organic layers. such as an electron transport layer, and the like.

Figure 2:
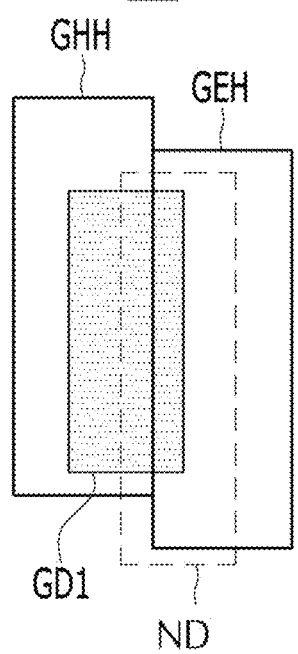
FIG. 2 is a band diagram of components in the green light-emitting layer of FIG. 1.
Figure 3:
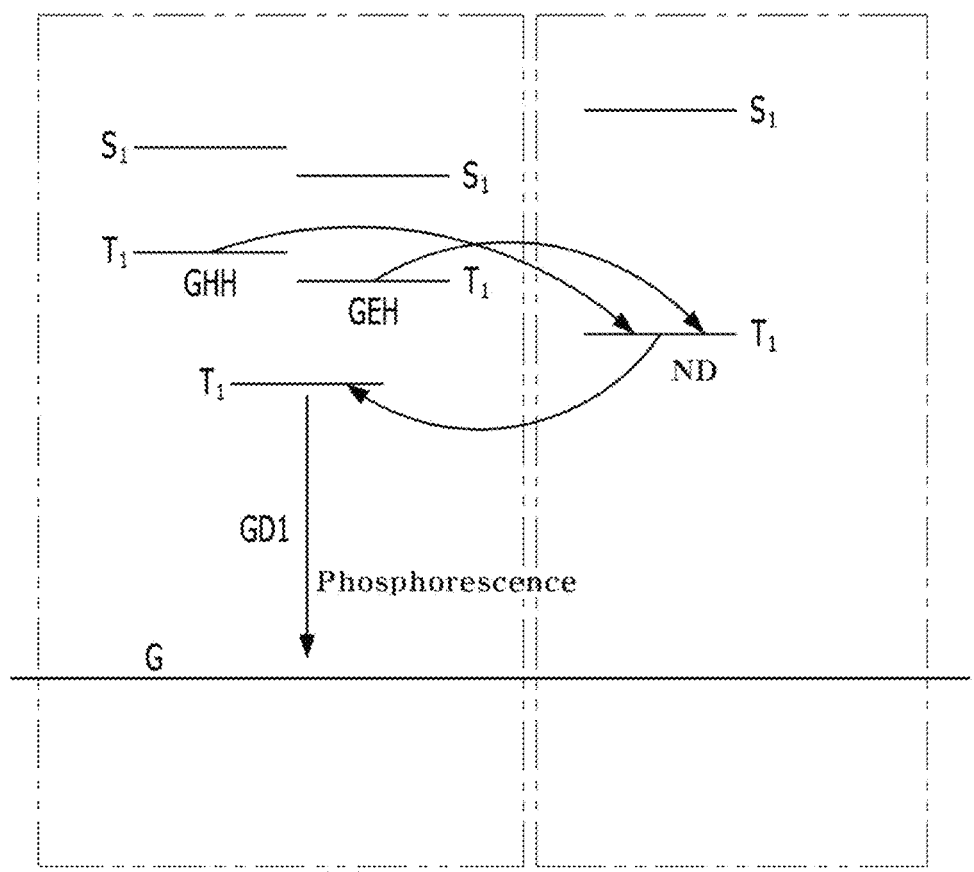
FIG. 3 is a diagram showing the light emission principle of the green light-emitting layer of FIG. 1.
Figure 4:
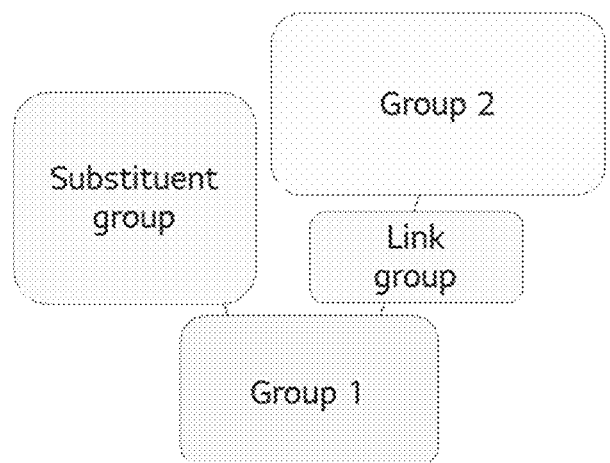
FIG. 4 is a diagram showing an example configuration of a second dopant.

Hereinafter, the present disclosure will be described with reference to the drawings. FIG. 1 is a cross-sectional view showing a white organic light-emitting device according to an example embodiment of the present disclosure. FIG. 2 is a band diagram of components in a green light-emitting layer of FIG. 1. FIG. 3 is a diagram showing the light emission principle of the green light-emitting layer of FIG. 1. FIG. 4 is a diagram showing the configuration of a second dopant.

As shown in the example of FIG. 1, a white organic light-emitting device according to a first example embodiment of the present disclosure includes a first electrode 110 and a second electrode 240, which may be disposed opposite each other on a substrate 100. The white organic light-emitting device may further include an organic stack OS, which may be provided between the first electrode and the second electrode.

The organic stack OS may include a plurality of light-emitting stacks BS1, RGS, and BS2 and charge generation layers 150 and 190 disposed between the light-emitting stacks.

Each layer in the organic stack OS of an example embodiment of the present disclosure may include an organic component as a main component, and may include an inorganic material, such as metal, to improve carrier transmission or light emission characteristics as needed.

The light emitted from each of the light-emitting layers of the light-emitting stacks BS1, RGS, and BS2 provided in the organic stack OS may be radiated to the first electrode 110 and/or the second electrode 240 to express a white color. When the first electrode 110 includes a reflective electrode and the second electrode 240 is a transparent electrode, the light may be radiated to the second electrode 240. When the first electrode 110 is a transparent electrode and the second electrode 240 includes a reflective electrode, the light may be radiated to the first electrode 110. In some cases, when both the first electrode 110 and the second electrode 240 are transparent electrodes, the light may travel in both directions.

In the example shown in FIG. 1, the first blue light-emitting stack BS1, the phosphorescent light-emitting stack RGS, and the second blue light-emitting stack BS2 may be sequentially arranged from the first electrode 110 to the second electrode 240. But this arrangement may be changed. To express a white color, only two stacks, which may be a blue light-emitting stack and a phosphorescent light-emitting stack, may be provided between the first electrode 110 and the second electrode 240. In some cases, four or more light-emitting stacks may be included. The number of light-emitting stacks may be changed depending on a required or desired color temperature. Thus, the color coordinate value may be changed in accordance with the color temperature of white light that the white organic light-emitting device intends to implement. When the light-emitting stacks have the same configuration, the color temperature may rise as the number of light-emitting stacks increases.

When three or more light-emitting stacks are provided between the first electrode 110 and the second electrode 240, two or more blue light-emitting stacks BS may be provided.

Each of the blue light-emitting stacks BS1 and BS2 may have an emission peak with a wavelength in a range of from 440 nm to 480 nm. The phosphorescent light-emitting stack RGS may have an emission peak within a range of a longer wavelength. For example, the phosphorescent light-emitting stack RGS may include heterogeneous light-emitting layers so as to have emission peaks within a range of a green wavelength and a range of a red wavelength, which are different from each other. Depending on the emission characteristics of a green dopant used for the green light-emitting layer, the green wavelength may have an emission peak within 500 nm to 540 nm so that pure green light may be emitted. Or, the green wavelength may have an emission peak within 540 nm to 580 nm so that yellowish-green light may be emitted. The red wavelength may have an emission peak within 600 nm to 640 nm.

Accordingly, blue light emitted from the blue light-emitting stacks BS1 and BS2 and green and red light emitted from the phosphorescent light-emitting stack RGS may be radiated to the first electrode 110 and/or the second electrode 240 and may be combined to finally implement white light.

The light-emitting stack BS1 may include a hole transport unit 120, a light-emitting layer 130, and an electron transport unit 140. The light-emitting stack RGS may include a hole transport unit 160, light-emitting layers 173 and 175, and an electron transport unit 180. The light-emitting stack BS2 may include a hole transport unit 210, a light-emitting layer 220, and an electron transport unit 230.

As shown in the example of FIG. 1, the hole transport unit 120 of the first blue light-emitting stack BS1 may include a hole injection layer 121, a first hole transport layer 122, and a second hole transport layer 123.

In the organic stack OS, the hole injection layer 121 may be a layer that may be in direct contact with the first electrode 110, which may include an inorganic material containing a transparent electrode component or a reflective electrode component. The hole injection layer 121 may lower interface stress and energy barrier so that holes may be smoothly injected into the organic stack OS from the interface with the first electrode 110. When the layer that is in contact with the first electrode 110 is another light-emitting unit, for example, the phosphorescent light-emitting unit, a hole injection layer may be provided in the phosphorescent light-emitting unit. Here, the first electrode 110 may function as an anode.

A reason why the first and second hole transport layers 122 and 123 may be included in the hole transport unit 120 in the first blue light-emitting unit BS1 may be to form an appropriate first blue optical distance from the first electrode 110, thereby generating resonance in which reflection and re-reflection may be advantageously repeated within the distance between the first electrode 110 and the second electrode 240. The first blue optical distance may be changed depending on the position of the reflective electrode among the first electrode 110 and the second electrode 240 and the thickness of the transparent electrode used as the first electrode 110 or the second electrode 240. In the hole transport unit 120, the thicknesses of the first and second hole transport layers 122 and 123 may be changed, or one of the first and second hole transport layers 122 and 123 may be omitted.

In addition, the first blue light-emitting unit BS1 may include a first blue light-emitting layer 130 and a first electron transport layer 140, which may be disposed on the hole transport unit 120.

The first blue light-emitting layer 130, which may be a light-emitting layer provided in the first blue light-emitting unit BS1, may include a host and a blue dopant, which emits light as a result of receiving energy from excitons generated from the host. The blue dopant may be a phosphorescent dopant or a fluorescent dopant, or may include the two dopants. In the following experimental examples, the first and second blue light-emitting layers 130 and 220 of the first and second blue light-emitting units BS1 and BS2 used to determine the white color coordinates included fluorescent blue dopants. Although the currently developed blue dopant may be capable of being used as a fluorescent blue dopant having a lifespan and efficiency of a predetermined level or more, a phosphorescent blue dopant having the same or similar level of lifespan and efficiency may be capable of replacing the fluorescent dopant. In the white organic light-emitting device according to an example embodiment of the present disclosure, a reason why the blue light-emitting stack may be provided separately from the phosphorescent light-emitting stack, which emits light of a longer wavelength than blue, may be to provide a sufficiently intense blue color, which may have lower visual recognition efficiency than other colors, when the display device may be required to show uniform color expression.

The phosphorescent light-emitting stack RGS disposed on the first blue light-emitting unit BS1 may include heterogeneous phosphorescent light-emitting layers. The phosphorescent light-emitting stack RGS may include a third hole transport layer 160, a red light-emitting layer 173, a green light-emitting layer 175, and a second electron transport layer 180.

In the phosphorescent light-emitting stack RGS, the red light-emitting layer 173 and the green light-emitting layer 175 may be in contact with each other. Further, the red light-emitting layer 173 may be in contact with the third hole transport layer 160, and the green light-emitting layer 175 may be in contact with the second electron transport layer 180. Each of the red light-emitting layer 173 and the green light-emitting layer 175 may be a phosphorescent light-emitting layer. To maximize the efficiency of excitons used for emission of red light and green light in the phosphorescent light-emitting stack, it may be preferable to prevent carriers or excitons (including singlet and triplet) from being biased to the first electrode 110 or the second electrode 240 and to cause excitons, holes and electrons to be concentrated on the interface between the red light-emitting layer 173 and the green light-emitting layer 175.

To this end, according to the white organic light-emitting device of an embodiment of the present disclosure, as shown in the example of FIG. 2, the green light-emitting layer 175 may include a hole-transporting host GHH, an electron-transporting host GEH, a first dopant GD1 having a green emission peak, and a non-emissive second dopant ND.

Here, the green light-emitting layer 175 may include two different dopants. The non-emissive second dopant ND may not emit light by itself. The non-emissive second dopant ND may transmit energy received from the hole-transporting host GHH and the electron-transporting host GEH, which may be included in the green light-emitting layer 175, to the first dopant GD1 so that excitation occurs in the first dopant GD1. Therefore, light emission may occur. In the second dopant ND, the difference between a singlet energy level S1 and a triplet energy level T1 ($\Delta Est=S1-T1$) may be 0.6 eV or more. Therefore, reverse intersystem crossing from the triplet energy level T1 to the singlet energy level S1 may be less likely to occur. In addition, since the energy band gap between the highest occupied molecular orbital (HOMO) level and the lowest unoccupied molecular orbital (LUMO) level may be large, excitons may not be formed, and the received energy may be transmitted to the first dopant GD1. In addition, to this end, the singlet energy level S1 of the second dopant ND may be greater than the singlet energy levels S1 of all of the hole-transporting host GHH, the electron-transporting host GEH, and the first dopant GD1. In addition, the singlet energy level of each of the hole-transporting host GHH and the electron-transporting host GEH may be 2.7 eV or more, and the second dopant ND may have a singlet energy level greater than the singlet energy level of each of the hole-transporting host GHH and the electron-transporting host GEH. Thus, the second dopant ND may have a singlet energy level greater than 2.7 eV.

In the green light-emitting layer 175, the second dopant ND may have a low HOMO energy level. Further, in the second dopant, electron mobility may be higher than hole mobility. In this case, because the hole mobility of the second dopant ND may be very low, the second dopant ND may not transport holes in the green light-emitting layer 175. But the second dopant ND may have electron transport properties such that the recombination region of holes and electrons in the green light-emitting layer 175 may be adjusted to the interface between the green light-emitting layer 175 and the red light-emitting layer 173. Therefore, luminous efficiency may be increased. In addition, the second dopant ND may prevent or reduce the possibility of the tail of the emission zone from contacting the second electron transport layer ETL2 (180). This may solve the problem of the shortening of the lifespan of the second electron transport layer ETL2 (180) due to accumulation of electrons, which may not be used for recombination of electrons and holes, at the interface between the second electron transport layer ETL2 (180) and the green light-emitting layer 175.

The first and second dopants GD1 and ND may be included in the green light-emitting layer 175 in a total amount of 0.02 vol % to 30 vol %. Therefore, the first and second dopants GD1 and ND may be distinguished from the hole-transporting host GHH and the electron-transporting host GEH, which may be the main materials. In addition, since the second dopant ND may have a low concentration of 0.01 vol % to 20 vol %, it may function to transfer energy to the first dopant GD1.

As shown in the example of FIG. 3, the triplet energy level T1 of the second dopant ND may be less than the triplet energy level T1 of each of the hole-transporting host GHH and the electron-transporting host GEH. The triplet energy level T1 of the second dopant ND may be greater than the triplet energy level of the first dopant GD1. The triplet energy level of the first dopant GD1 may be 2.4 eV or more. Due to this relationship between the singlet and triplet energy levels of the second dopant ND and the singlet and triplet energy levels of the hosts GHH and GEH and the first dopant GD1, it may be possible to effectively transfer the energy transferred to the second dopant ND to the first dopant GD1.

The second dopant ND may be, for example, a dopant material having an emission peak at a wavelength of 400 nm or less.

For example, as shown in the example of FIG. 4, the second dopant ND may have a link group between a first group, Group 1, and a second group, Group 2. An opposite side of the first group (that is not linked to the second group) may be formed from a compound linked to a substituent group. Here, the first group may function as a core in the compound, and may mainly include a component capable of forming a large energy band gap. The component constituting the first group may be a moiety having a weak donor and a weak acceptor, examples of which are shown in Formulas 1 to 4 below.

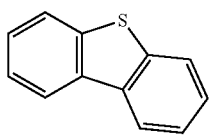

[Formula 1]

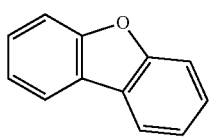

[Formula 2]

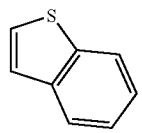

[Formula 3]

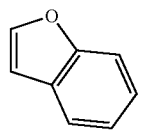

[Formula 4]

In addition, the second group may be required to extend the conjugation of molecules to have a low triplet energy level T1 and a large ΔEst value. The second group may include, for example, components of Formulas 5 to 7.

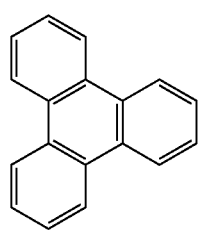

[Formula 5]

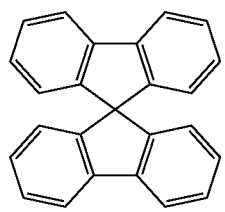

[Formula 6]

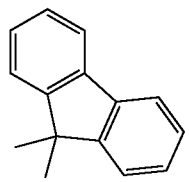

[Formula 7]

To increase ΔEst of the second dopant ND, relatively large HOMO-LUMO overlap may be advantageous. It may be preferable to exclude a substituent that induces steric hindrance.

The HOMO energy level of the second dopant ND may be lower than the HOMO energy level of the electron-transporting host GEH. The LUMO energy level of the second dopant ND may be higher than the LUMO energy level of the first dopant GD1.

In addition, the energy band gap Eg of the second dopant ND may be 3 eV or more. The HOMO energy level thereof may be −6.0 eV or less.

The triplet energy level of the second dopant may be lower than the triplet energy level of each of the hole-transporting host and the electron-transporting host, and may be higher than the triplet energy level of the first dopant. The triplet energy level of the first dopant may be 2.4 eV or more.

The second dopant ND may be, for example, a dopant having an emission peak at a wavelength of 400 nm or less. In this case, the second dopant ND may have an emission peak at a short wavelength less than or equal to that of visible light. However, because the green light-emitting layer 175 of an example embodiment of the present disclosure may have a large value of ΔEst and a large energy band gap and may need to transfer energy to the first dopant GD1, excitons may not be formed in the green light-emitting layer 175, and light may not be emitted therefrom.

The first dopant GD1 may be capable of forming excitons by itself and receiving a larger amount of energy from excitons of the hole-transporting host GHH and the electron-transporting host GEH than the second dopant ND. The first dopant GD1 may emit a phosphorescent light in an excited state while transition from the triplet energy level to a ground state occurs. It may be preferable that the concentration of the first dopant GD1 be in the range of 0.01 vol % to 10 vol %, based on a total volume of the hole-transporting host and the electron-transporting host, to prevent or reduce non-emitting quenching.

Because each of the hole-transporting host GHH and the electron-transporting host GEH in the green light-emitting layer 175 of an example embodiment of the present disclosure may form triplet excitons but may transfer energy to the first and second dopants GD1 and ND, light emission may not occur.

Each of the green light-emitting layer 175 and the red light-emitting layer 173 may be a phosphorescent light-emitting layer. To prevent triplet-polaron annihilation (TPA), which shortens the lifespan of hosts, a hole-transporting host and an electron-transporting host, which may be capable of adjusting the transport positions of holes and electrons in the light-emitting layers 173 and 175, may be mixed in a predetermined ratio and may be used as hosts of the light-emitting layers 173 and 175. In the green light-emitting layer 175, the ratio of the electron-transporting host to the hole-transporting host may be adjusted to a range of 2:8 to 8:2.

The green light-emitting layer 175 and the red light-emitting layer 173 may include both a hole-transporting host and an electron-transporting host, both of which may control injection efficiency of holes and electrons. Therefore, the injection efficiency of holes and electrons may be improved and a low drive voltage may be achieved. Further, it may be possible to individually control a hole-transporting property and an electron-transporting property. Therefore, the stress of the host may be reduced and the lifespan of the host may be lengthened. Further, it may be possible to increase efficiency by trapping holes and electrons in the dopant.

An electron-transporting host and a hole-transporting host may be dispersed in the red light-emitting layer 173 and the green light-emitting layer 175 in the phosphorescent light-emitting stack RGS. Holes transported from the third hole transport layer 160 may be transported at a constant rate without accumulating on the red light-emitting layer 173. For example, it may be possible to prevent a phenomenon in which holes may be pushed away from the rear ends of the heterogeneous light-emitting layers, i.e., from the first electrode 110, at a low grayscale level (a low-current density) due to the difference in the electric field dependence between holes and electrons. Therefore, the emission zone may be maintained at the interface between the red light-emitting layer 173 and the green light-emitting layer 175 and may not be changed. Therefore, even when the display device may have a difference between a low grayscale level and a high grayscale level for each region, it may be possible to secure uniformity of white color coordinates in low grayscale expression or high grayscale expression having a time difference, thereby enabling stable display.

The second blue light-emitting unit BS2 may include a hole transport unit 210, in which fourth and fifth hole transport layers 213 and 215 may be stacked. The second blue light-emitting unit BS2 may also include a second blue light-emitting layer 220 and a third electron transport layer 230.

In the example of FIG. 1, the second electrode 240 may include LiF and Al as inorganic compound components. LiF may function as an electron injection layer and Al may substantially function as a second electrode, which may be a cathode.

The electron injection layer may be alternatively formed of a material other than LiF, for example, a compound of alkali metal or alkali earth metal and halogen. In some cases, the electron injection layer may be omitted.

In addition, Al is an example material of the second electrode 240. The second electrode 240 may be formed of any other metal material, as long as it is capable of performing injection of electrons easily. In some cases, to form the second electrode 240, a plurality of reflective and transparent metal layers may be stacked such that only one of the plurality of metal layers is a reflective metal layer and the other metal layers are transparent metal layers.

As shown in the drawings, the charge generation layer 150 may be formed by stacking an n-type charge generation layer 151, which may be in contact with a neighboring lower light-emitting stack, and a p-type charge generation layer 153, which may be in contact with a neighboring upper light-emitting stack. The charge generation layer 190 may be formed by stacking an n-type charge generation layer 191, which may be in contact with a neighboring lower light-emitting stack, and a p-type charge generation layer 193, which may be in contact with a neighboring upper light-emitting stack. However, embodiments of the present disclosure are not limited thereto. The charge generation layer may be formed in a manner that an n-type dopant and a p-type dopant may be included in each of one or more hosts to generate electrons and holes and to supply the same to a neighboring stack.

In the example shown in FIG. 1, the first blue light-emitting stack BS1 may be located under the phosphorescent light-emitting stack RGS, and the second blue light-emitting stack BS2 may be located on the phosphorescent light-emitting stack RGS. However, the embodiments of the present disclosure are not limited thereto. The positions of the first and second blue light-emitting stacks BS1 and BS2 may be changed as needed.

Hereinafter, the function and effects of the white organic light-emitting device of example embodiments of the present disclosure will be shown in the following experiments.

Figure 5:
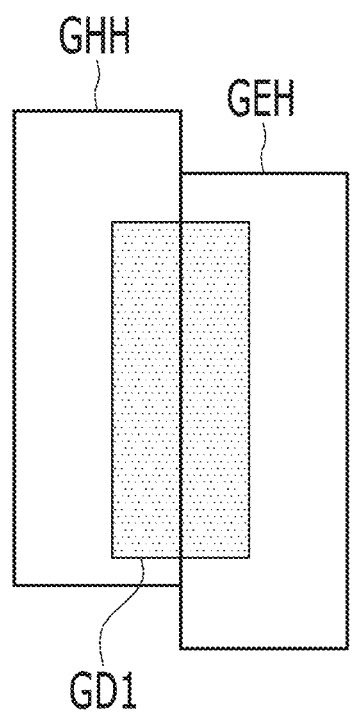
FIG. 5 is a band diagram of components in the green light-emitting layer according to a first experimental example of the present disclosure.
Figure 6:
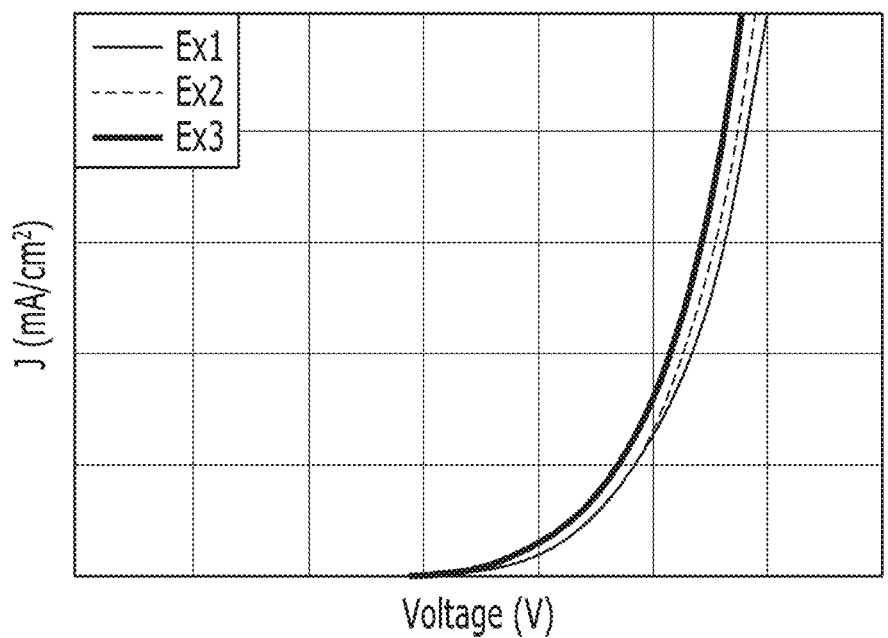
FIG. 6 is a graph showing the current density vs. voltage (J-V) curves of the first to third experimental examples.
Figure 7:
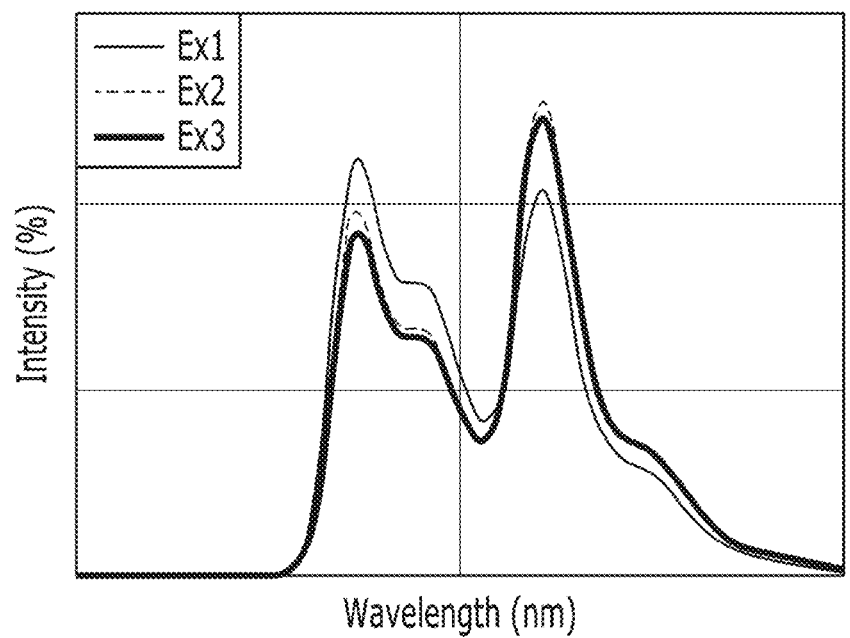
FIG. 7 is a graph showing the electroluminescence (EL) spectra of the first to third experimental examples.
Figure 8:
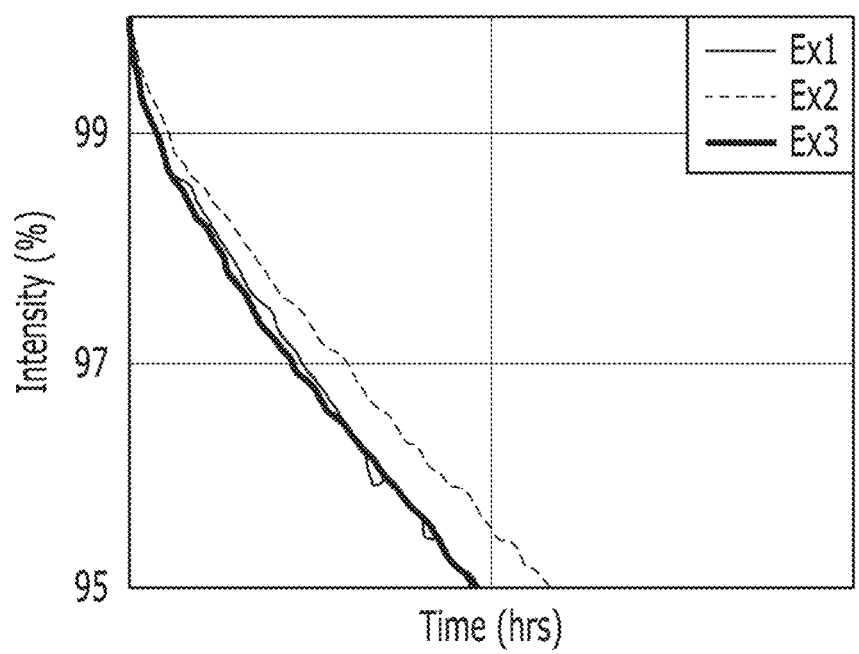
FIG. 8 is a graph showing the 95 lifespan of the red light-emitting layer in the first to third experimental examples.
Figure 9:
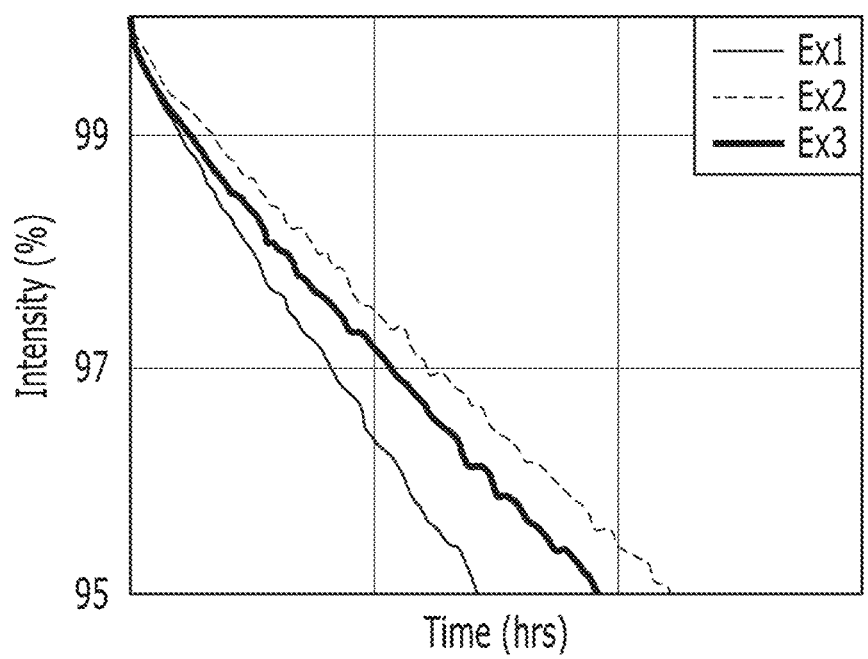
FIG. 9 is a graph showing the 95 lifespan of the green light-emitting layer in the first to third experimental examples.
Figure 10:
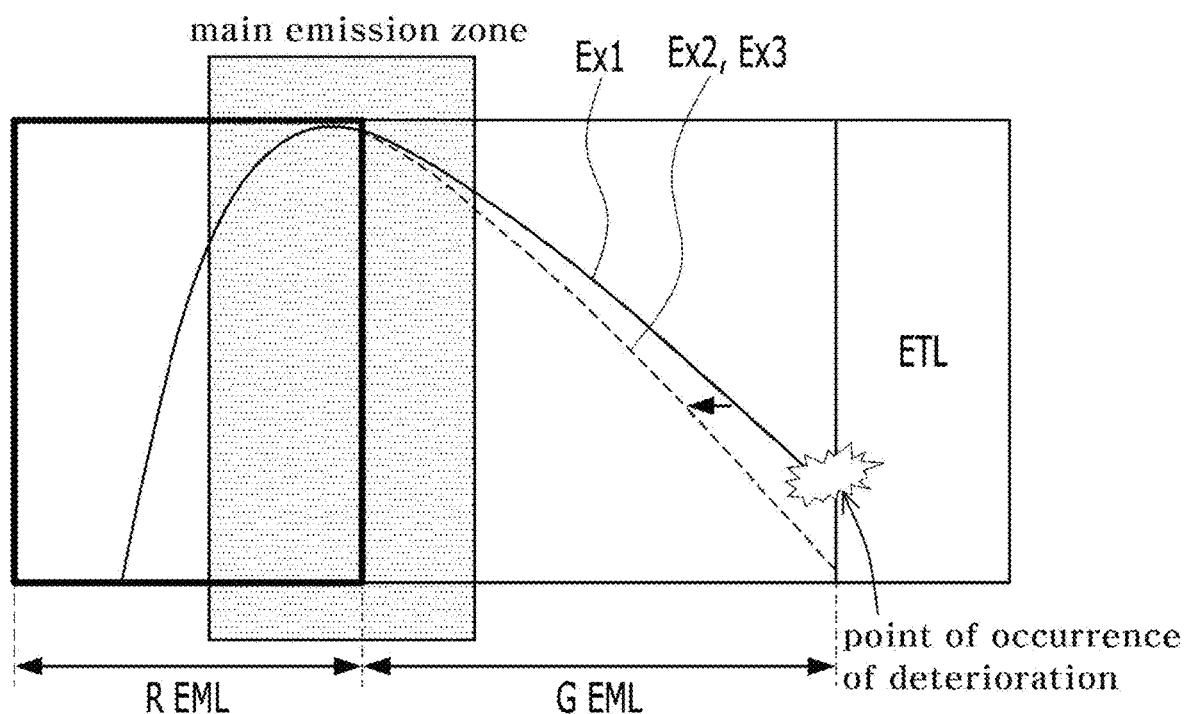
FIG. 10 is a diagram showing an emission zone in the red light-emitting layer and the green light-emitting layer in the first to third experimental examples.
Figure 11:
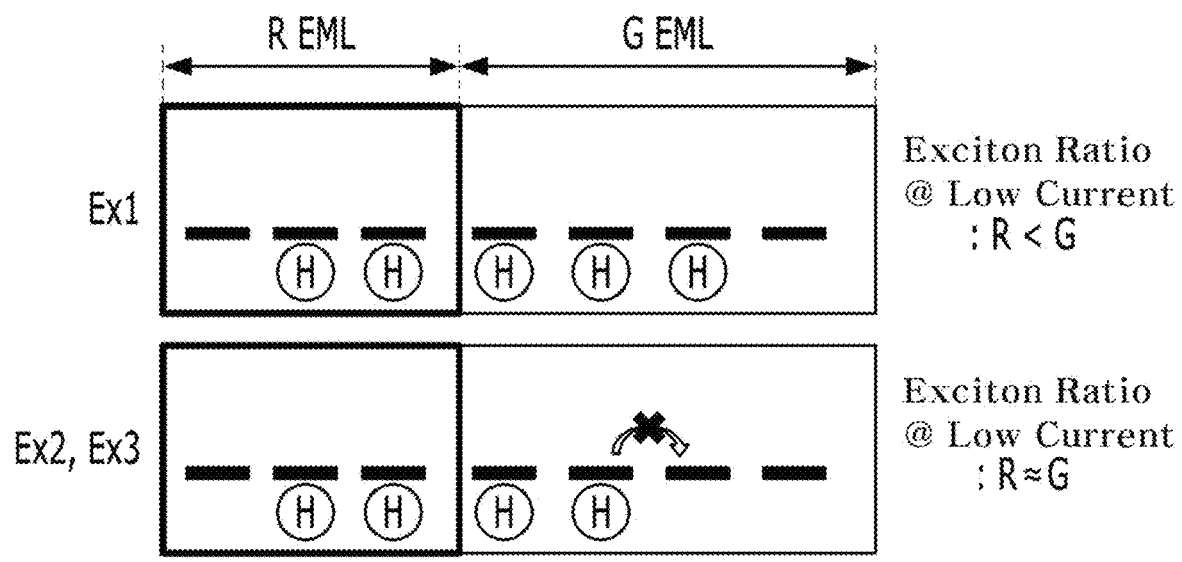
FIG. 11 is a diagram showing an exciton ratio of the red light-emitting layer to the green light-emitting layer in a low current state in the first to third experimental examples.

FIG. 5 is a band diagram of components in the green light-emitting layer according to a first experimental example of the present disclosure. FIG. 6 is a graph showing the current density vs. voltage (J-V) curves of the first to third experimental examples. FIG. 7 is a graph showing the electroluminescence (EL) spectra of the first to third experimental examples. FIG. 8 is a graph showing the 95 lifespan of the red light-emitting layer in the first to third experimental examples. FIG. 9 is a graph showing the 95 lifespan of the green light-emitting layer in the first to third experimental examples. FIG. 10 is a diagram showing an emission zone in the red light-emitting layer and the green light-emitting layer in the first to third experimental examples. FIG. 11 is a diagram showing an exciton ratio of the red light-emitting layer to the green light-emitting layer in a low current state in the first to third experimental examples.

According to the first experimental example Ex1, in the white organic light-emitting device having the stack structure of the example of FIG. 1, only the green light-emitting layer 75 had a single emissive green dopant GD1 in the hole-transporting host GHH and the electron-transporting host GEH, as shown in the example of FIG. 5. In the first experimental example Ex1, the ratio of the hole-transporting host GHH to the electron-transporting host GEH was 7:3, and the green dopant GD1 was present in an amount of 10 vol % relative to the total volume of the hole-transporting host GHH and the electron-transporting host GEH. The neighboring red light-emitting layer 173 was formed to have a thickness of 150 Å, and the green light-emitting layer 75 was formed to have a thickness of 350 Å.

According to the second experimental example Ex2, the green light-emitting layer 175 described with reference to the examples of FIGS. 1 and 2 had a hole-transporting host GHH, an electron-transporting host GEH, an emissive first dopant GD1, and a non-emissive second dopant ND. Each of the first dopant GD1 and the second dopant ND was included in the green light-emitting layer 175 in an amount of 10 vol % relative to the total volume of the hole-transporting host GHH and the electron-transporting host GEH. The second experimental example Ex2 differed from the above-described first experimental example Ex1 only in the first and second dopants GD1 and ND, and the relationship with the remaining neighboring layers and the thicknesses thereof were the same as those of the first experimental example Ex1.

Similar to the second experimental example, in the third experimental example Ex3, the green light-emitting layer 175 had a hole-transporting host GHH, an electron-transporting host GEH, an emissive first dopant GD1, and a non-emissive second dopant ND. However, the first dopant GD1 and the second dopant ND were respectively included in the green light-emitting layer 175 in amounts of 10 vol % and 20 vol % relative to the total volume of the hole-transporting host GHH and the electron-transporting host GEH.

The HOMO levels of the hole-transporting host GHH, the electron-transporting host GEH, and the first and second dopants GD1 and ND used in the experiment are shown in Table 1 below.

TABLE 1

| Material | HOMO Level (eV) |
|---|---|
| Hole-Transporting Host (GHH) | −5.37 |
| Electron-Transporting Host (GEH) | −5.99 |
| $1^{st}$ Dopant (GD1) | −5.10 |
| $2^{nd}$ Dopant (ND) | −6.16 |

In Table 2 below, the drive voltages of the second and third experimental examples Ex2 and Ex3 were compared with the drive voltage of the first experimental example Ex1. The values of external quantum efficiency (EQE) and the lifespan of red and green of the second and third experimental examples Ex2 and Ex3 were calculated on the assumption that the values of the first experimental example Ex1 were 100%.

TABLE 2

| | IVL @ 10 mA/cm² | | | | |
|---|---|---|---|---|---|
| | Drive | Voltage | | T95 | |
| Class. | Voltage (V) | (V) @ 100 J | EQE (%) | Lifespan of Red (%) | Lifespan of Green (%) |
| Ex1 | 0 | 0 | 100 | 100 | 100 |
| Ex2 | +0.05 | −0.1 | 103 | 122 | 155 |
| Ex3 | −0.1 | −0.22 | 101 | 100 | 134 |

As shown in Table 2 and the example of FIG. 6, in the second experimental example Ex2, the drive voltage slightly increased by 0.05 V at 10 mA/cm² compared to that of the first experimental example Ex1 but decreased in the high-grayscale operation of 100 J. In the third experimental example Ex3, the drive voltage decreased at 10 mA/cm² and in the high-grayscale operation of 100 J. Accordingly, these results showed that the second and third experimental examples Ex2 and Ex3, to which the structure according to example embodiments of the present disclosure was applied, were effective. In addition, as shown in the example of FIG. 7, which is an overlay of an EL spectrum for each wavelength in the first to third experimental examples Ex1, Ex2 and Ex3, the light emission intensity increased at a longer wavelength at which the phosphorescent light-emitting stack RGS emitted light in the second and third experimental examples Ex2 and Ex3.

In addition, as shown in the examples of FIGS. 8 to 11, the 95 lifespan of red and green (the time from the initial state to light emission at brightness of 95%) in the second and third experimental examples Ex2 and Ex3 was equal to or longer than that in the first experimental example Ex1.

Since the green light-emitting layer 175 of the second and third experimental examples Ex2 and Ex3 was further doped with the second dopant ND, the distribution of excitons of red and green as main emission components was not disturbed. Therefore, high efficiency could be achieved. In addition, it may be possible to lengthen the lifespan of the red-green stack RGS by controlling an excessive number of holes that may be transported to the red light-emitting layer or the second electron transport layer 180.

Figure 12:
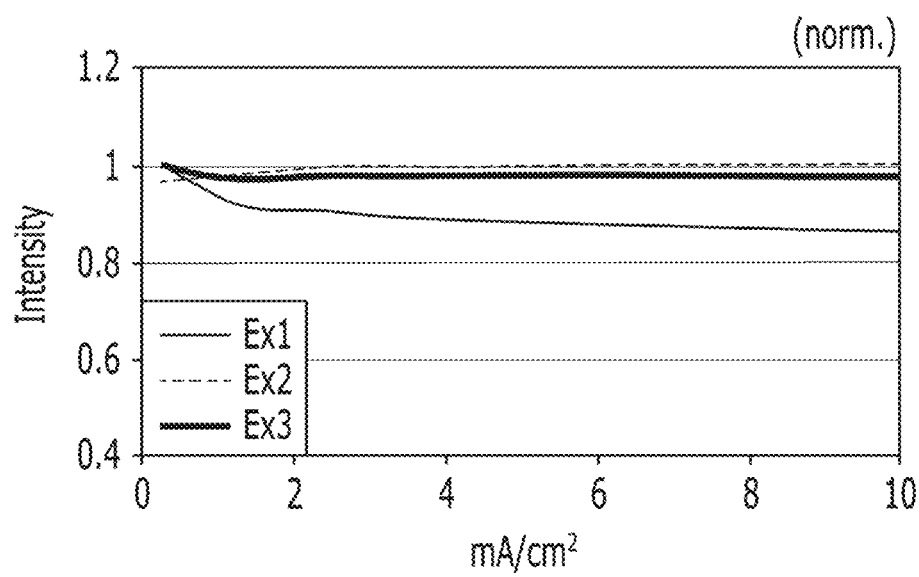
FIG. 12 is a graph showing green efficiency in accordance with a current density in the first to third experimental examples.

FIG. 12 is a graph showing green efficiency in accordance with a current density in the first to third experimental examples.

As shown in the example of FIG. 12, in the first experimental example Ex1, the green light intensity (e.g., green efficiency) varied linearly in response to the change in the low-grayscale current density of 10 mA/cm² or less. This means that, in the first experimental example Ex1, green light was strongly expressed at a low grayscale level, and color inversion of a panel is observed. In contrast, in the second and third experimental examples Ex2 and Ex3, green efficiency hardly changed in response to the change in the low-grayscale current density. This means that the second and third experimental examples Ex2 and Ex3, which were in accordance with the present disclosure, exhibited uniform efficiency without color inversion at a low grayscale level.

For example, in the second and third experimental examples Ex2 and Ex3, during low-current operation, the second dopant ND prevented or reduced an excessive number of holes from being transported to the green light-emitting layer and controlled low-current hole behavior. Therefore, green inversion at a low-current density was prevented or reduced.

Figure 13A:
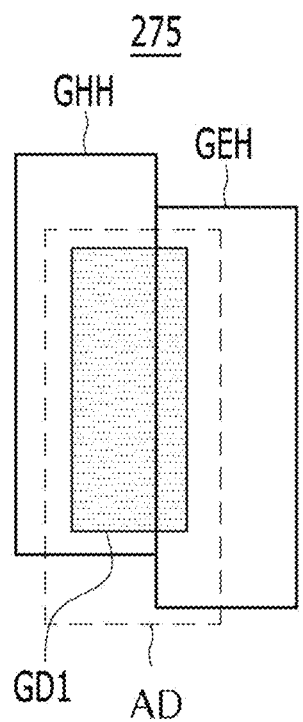
FIG. 13A is a diagram showing the configuration of a green light-emitting layer according to a fourth experimental example of the present disclosure.
Figure 13B:
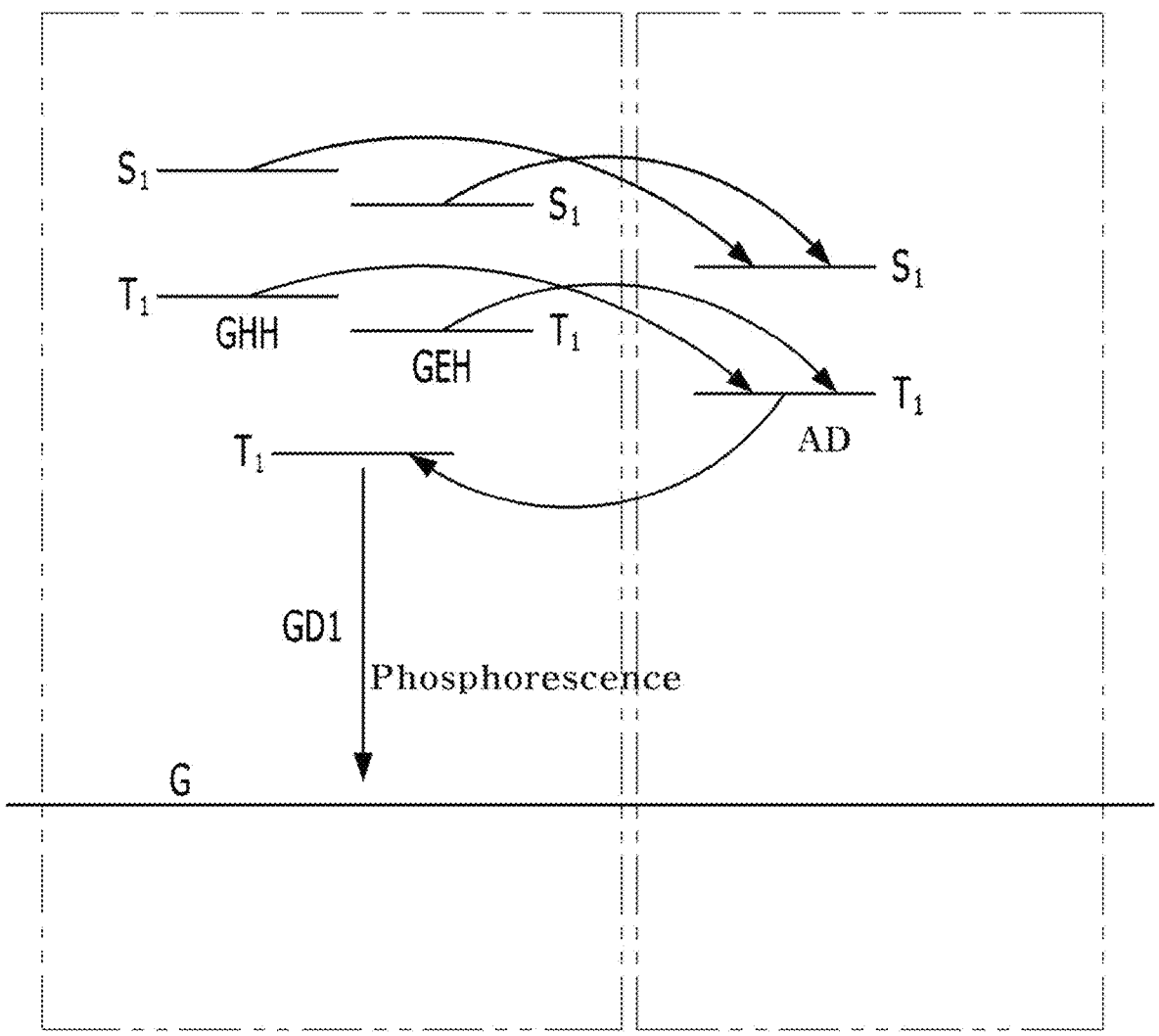
FIG. 13B is a diagram showing the light emission principle of the green light-emitting layer according to the fourth experimental example.

Hereinafter, to explain the effect obtained by an example configuration of the present disclosure in which the value of ΔEst of the second dopant ND is large, a structure in which the green light-emitting layer is doped with a third dopant AD, which may have a small value of ΔEst, in place of the second dopant ND will be described. FIG. 13A is a diagram showing the configuration of a green light-emitting layer according to a fourth experimental example of the present disclosure. FIG. 13B is a diagram showing the light emission principle of the green light-emitting layer according to the fourth experimental example.

As shown in the example of FIG. 13A, a green light-emitting layer 275 according to the fourth experimental example was configured such that a hole-transporting host GHH, an electron-transporting host GEH, an emissive first dopant GD1, and a third dopant AD were included in the green light-emitting layer 175 according to the second experimental example Ex2 described with reference to the examples of FIGS. 1 and 2.

As shown in the example of FIG. 13B, the third dopant AD had a singlet energy level that was lower than the singlet energy level S1 of each of the hole-transporting host GHH and the electron-transporting host GEH. Therefore, the third dopant AD had a small difference (ΔEst) between the singlet energy level and a triplet energy level T1 thereof. This third dopant AD had both a hole-transporting property and an electron-transporting property, and a portion of energy was transferred from the hole-transporting host GHH and the electron-transporting host GEH to the third dopant AD due to the low singlet energy level S1. But the third dopant AD did not make excitons that were used for emission and was not used for light emission. Thus, the third dopant AD was quenched.

Table 3 below shows the difference in physical properties between the hole-transporting host GHH, the electron-transporting host GEH, and the first dopant GD1, which were common in the first to fourth experimental examples Ex1 to Ex4, the second dopant ND, which was additionally used in the second and third experimental examples Ex2 and Ex3, and the third dopant AD, which was additionally used in the fourth experimental example Ex4.

TABLE 3

|  | Host | | Dopant | | |
| --- | --- | --- | --- | --- | --- |
|  | GHH | GEH | GD1 | ND | AD |
| Hole Transport | ○ | X | △ | X | △ |
| Electron Transport | X | ○ | △ | △ | △ |
| Exciton Formation | ○ | ○ | ○ | X | ○ |
| Light Emission | X | X | ○ | X | X |
| Transition of Energy to GD1 | ○ | ○ | X | ○ | ○ |

Figure 14:
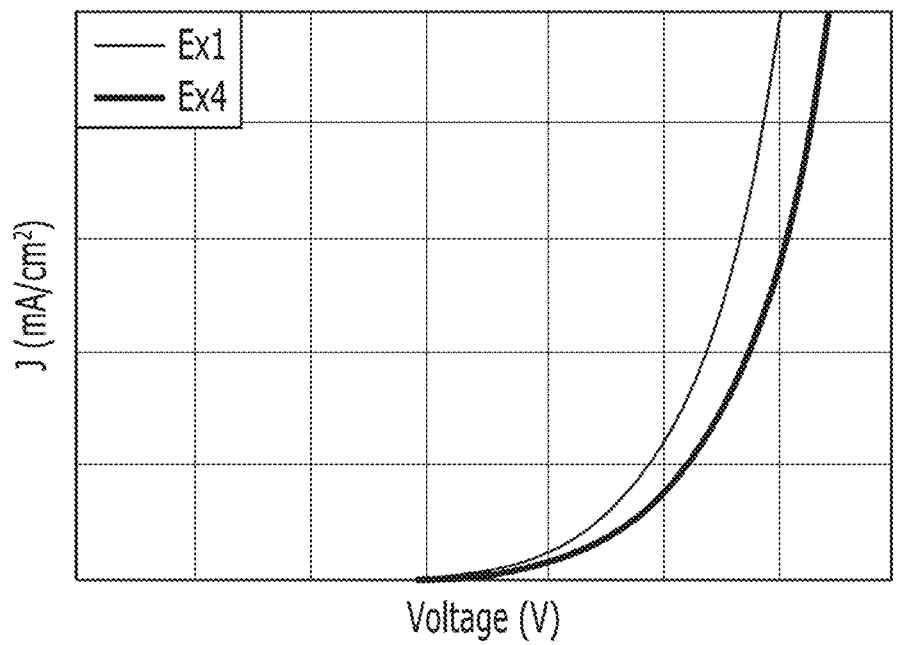
FIG. 14 is a graph showing the J-V curves of the first and fourth experimental examples.
Figure 15:
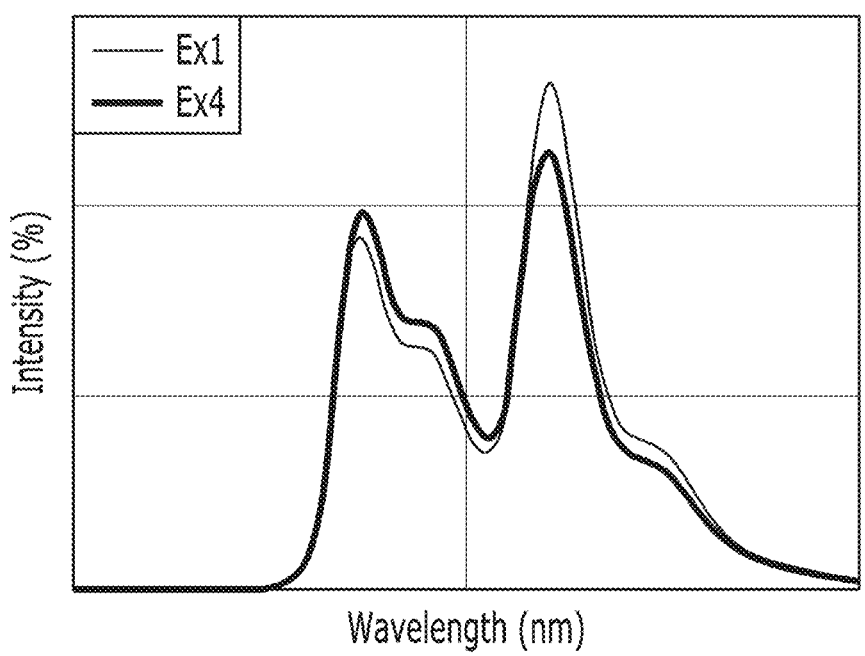
FIG. 15 is a graph showing the EL spectra of the first and fourth experimental examples.
Figure 16:
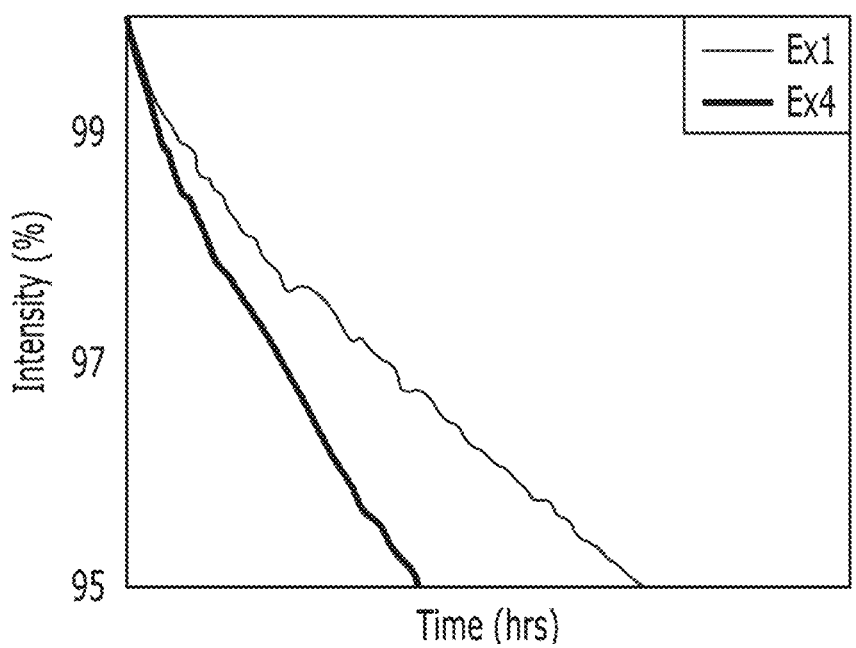
FIG. 16 is a graph showing the 95 lifespan of the red light-emitting layer in the first and fourth experimental examples.
Figure 17:
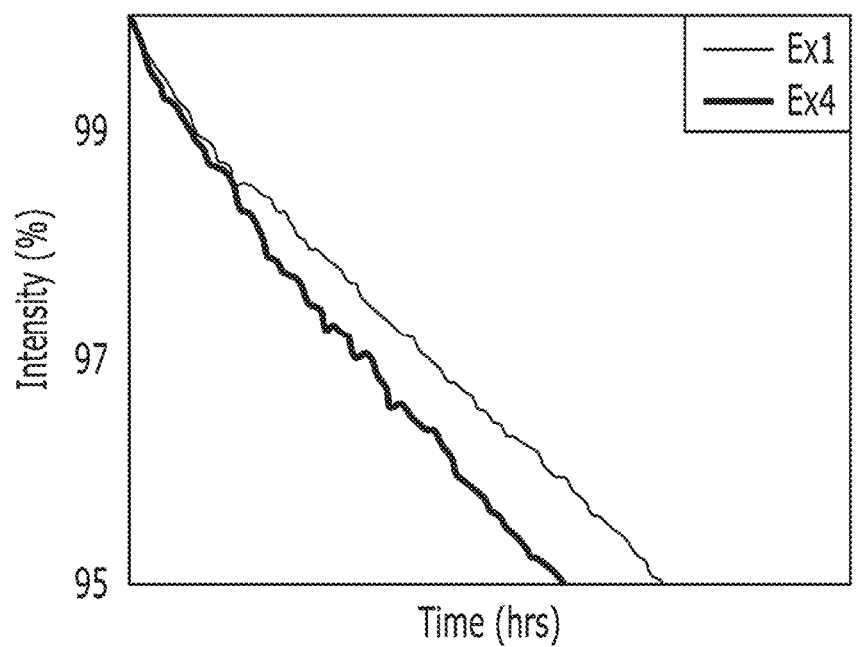
FIG. 17 is a graph showing the 95 lifespan of the green light-emitting layer in the first and fourth experimental examples.

Table 4 below shows the drive voltage characteristics, external quantum efficiency (EQE), and 95 lifespan of the first and fourth experimental examples Ex1 and EX4. FIG. 14 is a graph showing the J-V curves of the first and fourth experimental examples. FIG. 15 is a graph showing the EL spectra of the first and fourth experimental examples. FIG. 16 is a graph showing the 95 lifespan of the red light-emitting layer in the first and fourth experimental examples. FIG. 17 is a graph showing the 95 lifespan of the green light-emitting layer in the first and fourth experimental examples.

TABLE 4

| | IVL @ 10 mA/cm$^2$ | | | | |
| --- | --- | --- | --- | --- | --- |
| | Drive | Voltage | | T95 | |
| Class. | Voltage (V) | (V) @ 100 J | EQE (%) | Lifespan of Red (%) | Lifespan of Green (%) |
| Ex1 | 0 | 0 | 100 | 100 | 100 |
| Ex4 | +0.03 | +0.04 | 96 | 56 | 82 |

In Table 4 above, the drive voltage of the fourth experimental example Ex4 was compared with the drive voltage of the first experimental example Ex1. The values of external quantum efficiency (EQE) and the lifespan of red and green of the fourth experimental example Ex4 were calculated on the assumption that the values of the first experimental example Ex1 were 100%. Compared to the second experimental example Ex2, the fourth experimental example Ex4 had a third dopant AD instead of the second dopant ND. In this case, similar to the first dopant GD1, the third dopant AD was included in the green light-emitting layer in an amount of 10 vol % relative to the total volume of the two hosts GHH and GEH.

As shown in Table 4 and the example of FIG. 14, the drive voltage of the fourth experimental example Ex4 increased beyond that of the first experimental example Ex1. As shown in the example of FIG. 15, the light emission intensity in the fourth experimental example Ex4 became lower than that of the first experimental example Ex1. As shown in the examples of FIGS. 16 and 17, the lifespan of the fourth experimental example Ex4 became shorter than that of the first experimental example Ex1.

It can be seen from the fourth experimental example Ex4 that, when the third dopant GD having a small value of ΔEst was present in the host together with the light-emitting dopant, the white organic light-emitting device had poor efficiency and was unstable.

In contrast, compared to the first experimental example in which a single light-emitting dopant is provided, the white organic light-emitting device according to the second and third experimental examples of the present disclosure is advantageous. For example, the drive voltage was reduced, the external quantum efficiency was improved, and the lifespan was lengthened.

Figure 18A:
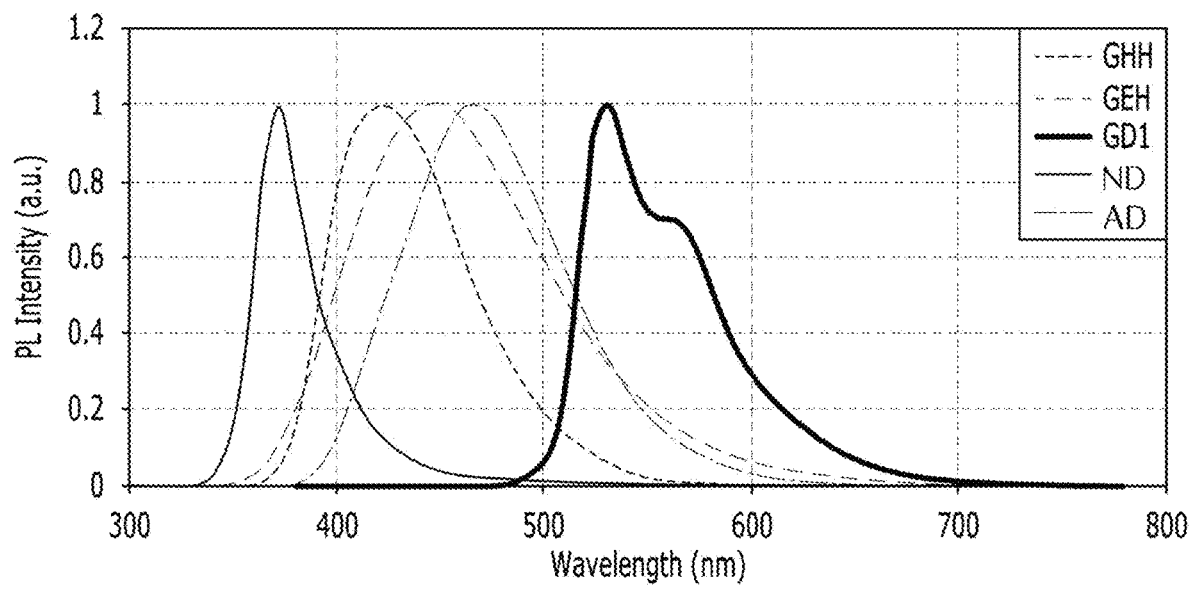
FIG. 18A is a graph showing the photoluminescence (PL) intensity for each of a first green host GHH, a second green host GEH, and first to third green dopants used in the experimental examples of the present disclosure.
Figure 18B:
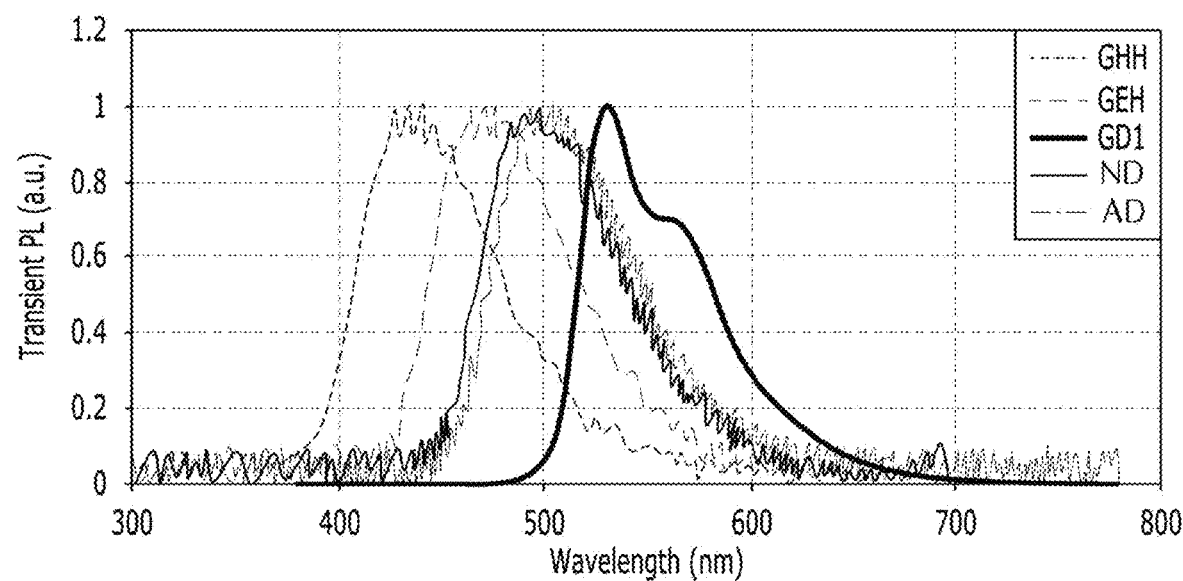
FIG. 18B is a graph showing the transient PL intensity for each of the first green host GHH, the second green host GEH, and the first to third green dopants used in the experimental examples of the present disclosure.

Hereinafter, the singlet and triplet characteristics of the material included in the green light-emitting layer will be described in relation to the wavelength characteristics. FIG. 18A is a graph showing the photoluminescence (PL) intensity for each of a first green host GHH, a second green host GEH, and first to third green dopants used in the experimental examples of the present disclosure. FIG. 18B is a graph showing the transient PL intensity for each of the first green host GHH, the second green host GEH, and the first to third green dopants used in the experimental examples of the present disclosure.

FIG. 18A shows the photoluminescence (PL) characteristics of each material at room temperature to examine the singlet energy level (S1) characteristics of each material. FIG. 18B shows an excited state in which light was radiated in the state in which a strong electric field was generated at the absolute temperature of 77K and the delay time from formation of the excited state to emission of light was set to 1 μs to examine the triplet energy level (T1) characteristics of each material.

The singlet energy level S1 and the triplet energy level T1 of each material were calculated by converting a wavelength at a point at which the curve of the graph of each material forms a tangent to the wavelength into an energy value.

Here, comparing the examples of FIG. 18A and FIG. 18B, it can be seen that the transient PL spectrum of the second dopant ND was shifted from the PL spectrum thereof by about 100 nm or more. A reason for this is that the second dopant has a large value of ΔEst.

As described above, in the white organic light-emitting device of an example embodiment of the present disclosure, the green light-emitting layer may include the emissive first dopant and the non-emissive second dopant, which may not be self-excited, may not contribute to light emission, may transfer energy to the first dopant GD1, and may limit an emission zone through transport of electrons in the green light-emitting layer. Therefore, accumulation of electrons at the interface with a neighboring electron transport layer may be prevented or reduced, the efficiency of the device may be improved, and the lifespan of the device may be lengthened.

Figure 19A:
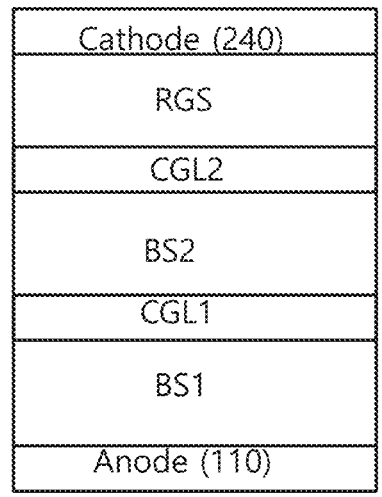
FIGS. 19A to 19C are cross-sectional views showing white organic light-emitting devices according to other example embodiments of the present disclosure.
Figure 19B:
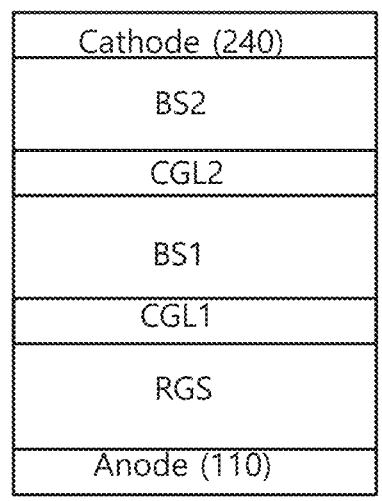
Figure 19C:
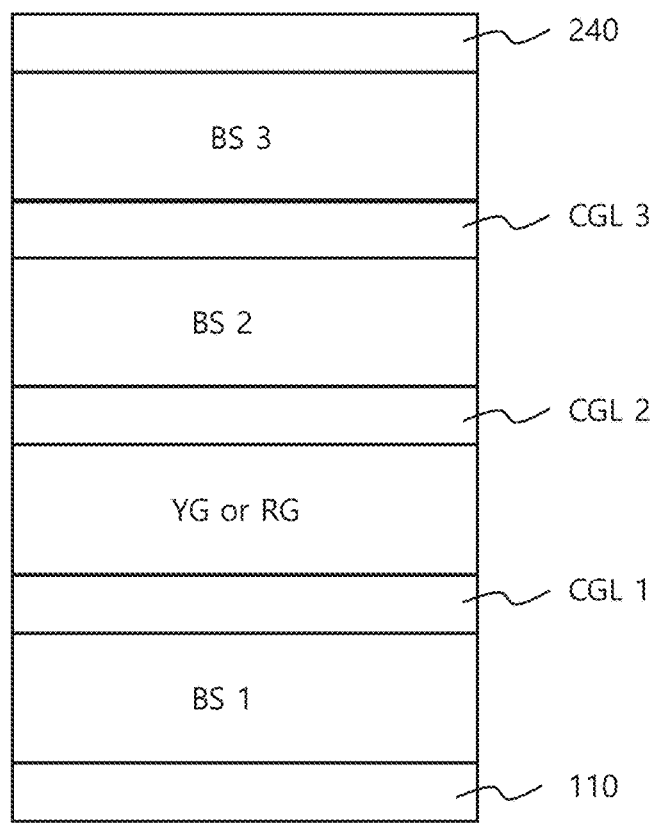

FIGS. 19A to 19C are cross-sectional views showing white organic light-emitting devices according to other example embodiments of the present disclosure.

FIG. 19A shows a white organic light-emitting device according to a second example embodiment of the present disclosure, in which a first blue light-emitting stack BS1, a second blue light-emitting stack BS2, and a phosphorescent light-emitting stack RGS may be sequentially stacked between a first electrode 110 and a second electrode 240.

In this example embodiment, the phosphorescent light-emitting stack RGS may have heterogeneous light-emitting layers, which may be the red light-emitting layer 173 and the green light-emitting layer 175 described with reference to the example of FIG. 1. In addition to an emissive first dopant, the green light-emitting layer 175 may have a non-emissive second dopant, which may have a large value of ΔEst, may not be self-excited, may not contribute to light emission, and may transfer energy to the first dopant GD1. Therefore, efficiency may be improved and drive voltage may be reduced.

In addition, the second dopant may limit an emission zone through transport of electrons in the green light-emitting layer. Therefore, accumulation of electrons at the interface with a neighboring electron transport layer may be prevented or reduced, the efficiency of the device may be improved, and the lifespan of the device may be lengthened.

In addition, as shown in the example of FIG. 19B, a white organic light-emitting device according to a third example embodiment of the present disclosure is configured such that a phosphorescent light-emitting stack RGS, a first blue light-emitting stack BS1, and a second blue light-emitting stack BS2 are sequentially stacked between a first electrode 110 and a second electrode 240.

In the white organic light-emitting device according to the third example embodiment, the phosphorescent light-emitting stack RGS may have heterogeneous light-emitting layers, which may be the red light-emitting layer 173 and the green light-emitting layer 175 described with reference to the example of FIG. 1. Accordingly, light emission may be concentrated on the interface between the red light-emitting layer 173 and the green light-emitting layer 175 irrespective of a current density. Therefore, uniform white color coordinate characteristics may be exhibited.

The charge generation layer described above may be included between the light-emitting stacks BS1, BS2, and RGS.

In addition, as shown in the example of FIG. 19C, four or more stacks may be provided between the first electrode 110 and the second electrode 240. Among the four or more stacks, at least three stacks may be implemented as blue light-emitting stacks BS1, BS2, and BS3, and at least one stack may be implemented as the phosphorescent light-emitting stack RGS described above.

Charge generation layers CGL1, CGL2, and CGL3 may be included between the light-emitting stacks.

In the white organic light-emitting device of the above-described example embodiments, it may be preferable that the position of the light-emitting layer in each light-emitting stack be set to a position at which the light emitted from the light-emitting layer is advantageously resonated. When the blue light-emitting layer and the light-emitting layer of another color are located in a stack, which may have an arrangement structure different from that shown in the example of FIG. 1, between the first electrode 110 and the second electrode 240, the distance to the first electrode may be adjusted by changing the thickness of the neighboring charge generation layer 150 or 190 or the hole transport units 120 and 210.

Although the examples of FIGS. 1 and 19A to 19C illustrate embodiments in which the three-layered light-emitting stack structure or the four-layered light-emitting stack structure may be included between the first electrode 110 and the second electrode 240, a blue light-emitting stack and/or a phosphorescent light-emitting stack may be additionally included to improve luminous efficiency.

Figure 20:
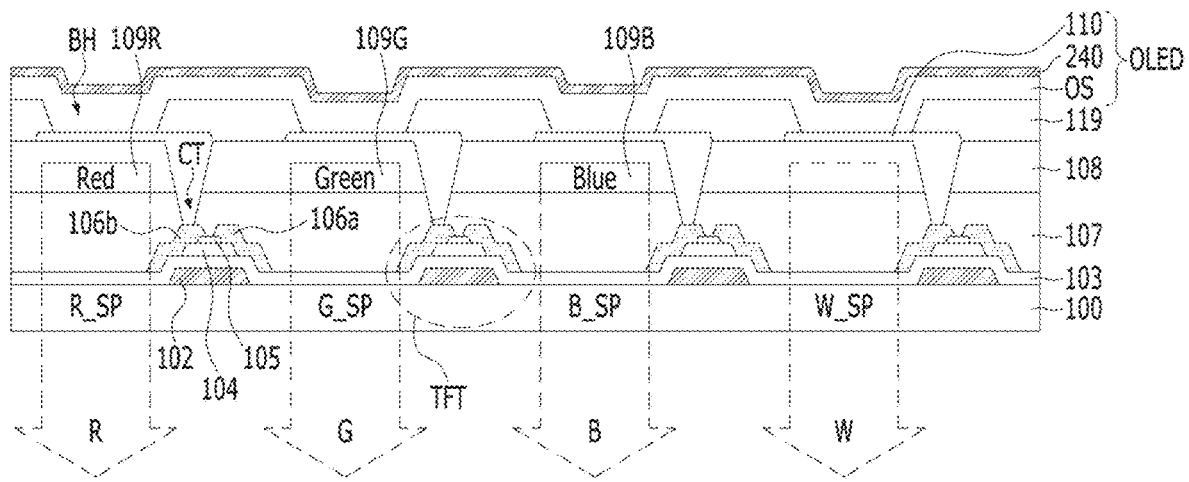
FIG. 20 is a cross-sectional view showing a display device including an example embodiment of the white organic light-emitting device of the present disclosure.

FIG. 20 is a cross-sectional view showing a display device including an example embodiment of the white organic light-emitting device according to the present disclosure.

As shown in the example of FIG. 20, a display device of an example embodiment of the present disclosure may include a substrate 100, which may have a plurality of sub-pixels R_SP, G_SP, B_SP and W_SP, a white organic light-emitting device OLED (refer to the example of FIG. 1), which may be provided in the sub-pixels R_SP, G_SP, B_SP, and W_SP of the substrate 100, a thin-film transistor TFT, which may be provided in each of the sub-pixels and may be connected to the first electrode 110 of the white organic light-emitting device OLED, and color filter layers 109R, 109G and 109B, which may be provided under the first electrode 110 of at least one of the sub-pixels.

Although the display device may be illustrated as including the white sub-pixel W_SP, the embodiments of the present disclosure are not limited thereto. The white sub-pixel W_SP may be omitted, and only the red, green and blue sub-pixels R_SP, G_SP, and B_SP may be included. In some cases, the red, green. and blue sub-pixels may be replaced by a cyan sub-pixel, a magenta sub-pixel, and a yellow sub-pixel, which may be capable of expressing white in combination.

The thin-film transistor TFT may include, for example, a gate electrode 102, a semiconductor layer 104, a source electrode 106a, which may be connected to one side of the semiconductor layer 104, and a drain electrode 106b, which may be connected to the opposite side of the semiconductor layer 104.

A gate insulating film 103 may be provided between the gate electrode 102 and the semiconductor layer 104.

The semiconductor layer 104 may be formed of a material selected from the group consisting of amorphous silicon, polycrystalline silicon, an oxide semiconductor, and combinations thereof. For example, when the semiconductor layer 104 is formed of an oxide semiconductor, an etch stopper 105 may be further provided to be in direct contact with the upper surface of the semiconductor layer 104 to prevent or reduce damage to a channel portion of the semiconductor layer 104.

In addition, the drain electrode 106b of the thin-film transistor TFT may be connected to the first electrode 110 in the region of a contact hole CT, which may be formed in first and second protective films 107 and 108.

The first protective film 107 may be provided to primarily protect the thin-film transistor TFT. The color filter layers 109R, 109G, and 109B may be provided on the first protective film 107.

When the plurality of sub-pixels includes a red sub-pixel, a green sub-pixel, a blue sub-pixel, and a white sub-pixel, each of the first to third color filter layers 109R, 109G, and 109B may be provided in a corresponding one of the sub-pixels other than the white sub-pixel W_SP to transmit white light, which may have passed through the first electrode 110, for each wavelength. The second protective film 108 may be formed under the first electrode 110 to cover the first to third color filter layers 109R, 109G and 109B. The first electrode 110 may be formed on the surface of the second protective film 108 except for the contact hole CT.

Here, the white organic light-emitting device OLED may be configured such that a two-layered stack structure, which may include a blue light-emitting stack S1 and a long-wavelength (R/G or YG) (phosphorescent) light-emitting stack S2, or a three-layered stack structure, which may include a first blue light-emitting stack BS1, a phosphorescent light-emitting stack RGS, and a second blue light-emitting stack BS2 (refer to the examples of FIGS. 1, 19A and 19B), may be disposed between the first electrode 110, which may be transparent, and the second electrode 240, which may be reflective and may be disposed opposite the first electrode 110. Alternatively, at least one of the blue light-emitting stacks (e.g., BS1 and BS2) or the phosphorescent light-emitting stack RGS described above may be provided in a plurality, and a charge generation layer may be provided between the light-emitting stacks to form the structure of an organic stack OS. In this example embodiment, the plurality of light-emitting stacks may have the same structure.

In the example of FIG. 20, reference numeral 119 represents a bank, and "BH" between the banks represents a bank hole. Light emission may be performed in a region that may be open through the bank hole. The bank hole may define an emission portion of each sub-pixel.

The display device shown in FIG. 20 is a bottom emission-type display device.

However, the embodiments of the present disclosure are not limited to a bottom emission-type display device. The display device of an example embodiment of the present disclosure may be implemented as a top emission-type display device by changing the structure shown in the example of FIG. 20 such that the color filter layers may be located on the second electrode 240, a reflective metal may be included in the first electrode 110, and the second electrode 240 may be formed as a transparent electrode or may be formed of semi-transmissive metal.

Alternatively, the color filter layers may be omitted and both the first electrode 110 and the second electrode 240 may be formed as transparent electrodes. Therefore, a transparent organic light-emitting device may be formed.

In the white organic light-emitting device and the display device using the same according to example embodiments of the present disclosure, the configuration of the phosphorescent light-emitting stack, which may include heterogeneous light-emitting layers bonded to each other, may be changed to compensate for the difference between the hole mobility and the electron mobility at the time of change in an electric field. When the electric field changes and when a white light-emitting device is driven without compensating for a phenomenon that electron dependency may be larger than hole dependency, an emission zone may change depending on a current density. Therefore, it may not be possible to obtain a uniform white spectrum or uniform color coordinates depending on a current density and may result in a defective panel. To solve this problem, in the heterogeneous light-emitting layers according to an example embodiment of the present disclosure, which may include the red light-emitting layer and the green light-emitting layer, the HOMO level of the red dopant may be set to be lower than the HOMO level of a neighboring hole transport layer so that holes may not be trapped in a specific region in the red light-emitting layer. Therefore, it may be possible to constantly and reliably generate an emission zone at the interface between the red light-emitting layer and the green light-emitting layer. Accordingly, in the red light-emitting layer, carriers may not be trapped in the red dopant in a region adjacent to a hole transport layer and may be smoothly transported to the interface with the green light-emitting layer.

In addition, it may be possible to effectively reduce a change in hole and electron carrier transport rate in the red light-emitting layer using an electron-transporting host as a host included in the red light-emitting layer. Therefore, a uniform emission zone may be maintained irrespective of a change in current density.

Accordingly, since the emission zone may be constantly and uniformly maintained at the interface between the red light-emitting layer and the green light-emitting layer, it may be possible to secure uniform white color coordinates even when a current density changes.

A white organic light-emitting device according to an example embodiment of the present disclosure may include a first electrode, a second electrode, the second electrode and the first electrode may face each other, a blue light-emitting stack, a phosphorescent light-emitting stack that may include a hole transport layer, an electron transport layer, a red light-emitting layer, a green light-emitting layer that may include a hole-transporting host, an electron-transporting host, a first dopant having a green emission peak, and a non-emissive second dopant. The blue light-emitting stack and the phosphorescent light-emitting stack may be between the first electrode and the second electrode, with a charge generation layer interposed between the blue light-emitting stack and the phosphorescent light-emitting stack.

In some example embodiments, a difference, $\Delta$Est, between a singlet energy level of the second dopant and a triplet energy level of the second dopant may be 0.6 eV or more.

In some example embodiments, a singlet energy level of the second dopant may be greater than a singlet energy level of each of the hole-transporting host, the electron-transporting host, and the first dopant. The singlet energy level of each of the hole-transporting host and the electron-transporting host may be 2.7 eV or more.

In some example embodiments, a triplet energy level of the second dopant may be less than a triplet energy level of each of the hole-transporting host and the electron-transporting host, and may be greater than a triplet energy level of the first dopant. The triplet energy level of the first dopant may be 2.4 eV or more.

In some example embodiments, the second dopant may have an emission peak at a wavelength of 400 nm or less.

In some example embodiments, a highest occupied molecular orbital, HOMO, energy level of the second dopant may be lower than a HOMO energy level of the electron-transporting host. A lowest unoccupied molecular orbital, LUMO, energy level of the second dopant may be higher than a LUMO energy level of the first dopant.

In some example embodiments, the second dopant may have an energy band gap of 3 eV or more and a HOMO energy level of −6.0 eV or less.

In some example embodiments, an electron mobility of the second dopant may be higher than a hole mobility of the second dopant.

In some example embodiments, the first dopant and the second dopant may be present in the green light-emitting layer in a total amount of from 0.02 vol % to 30 vol %, based on a total volume of the hole-transporting host and the electron-transporting host. The second dopant may be present in the green light-emitting layer in an amount of from 0.01 vol % to 20 vol %, based on the total volume of the hole-transporting host and the electron-transporting host.

In some example embodiments, the blue light-emitting stack may include a first blue light emitting stack and a second blue light-emitting stack between the first electrode and the second electrode.

In some example embodiments, the first and second blue light-emitting stacks may be disposed adjacent to the first electrode or the second electrode. Or, the phosphorescent light-emitting stack may be disposed the first blue light-emitting stack and the second blue light-emitting stack, a first charge generation layer may be interposed between the phosphorescent light-emitting stack and the first blue light-emitting stack, and a second charge generation layer may be interposed between the phosphorescent light-emitting stack and the second blue light-emitting stack.

In some example embodiments, the red light-emitting layer may have an emission peak at a wavelength of from 600 nm to 640 nm. The green light-emitting layer may have an emission peak at a wavelength of from 500 nm to 540 nm.

In some example embodiments, the red light-emitting layer may have an emission peak at a wavelength of from 600 nm to 640 nm. The green light-emitting layer may have an emission peak at a wavelength of from 540 nm to 580 nm.

A display device according to an example embodiment of the present disclosure may include a substrate including a thin-film transistor provided in each of sub-pixels, a first electrode connected to the thin-film transistor in each of the sub-pixels, a second electrode over the sub-pixels and spaced apart from the first electrode, a blue light-emitting stack, a phosphorescent light-emitting stack that may include a hole transport layer, an electron transport layer, a red light-emitting layer, and a green light-emitting layer that may include a hole-transporting host, an electron-transporting host, a first dopant having a green emission peak, and a non-emissive second dopant. The blue light-emitting stack and the phosphorescent light-emitting stack may be between the first electrode and the second electrode, and a charge generation layer may be interposed between the blue light-emitting stack and the phosphorescent light-emitting stack.

In some example embodiments, a difference, ΔEst, between a singlet energy level of the second dopant and a triplet energy level of the second dopant may be 0.6 eV or more.

In some example embodiments, a singlet energy level of the second dopant may be greater than a singlet energy level of each of the hole-transporting host, the electron-transporting host, and the first dopant. The singlet energy level of each of the hole-transporting host and the electron-transporting host may be 2.7 eV or more.

In some example embodiments, a triplet energy level of the second dopant may be less than a triplet energy level of each of the hole-transporting host and the electron-transporting host, and may be greater than a triplet energy level of the first dopant. The triplet energy level of the first dopant may be 2.4 eV or more.

As is apparent from the above description, a white organic light-emitting device and a display device including the same may have the following effects.

Since a green light-emitting layer, which may be bonded to a red light-emitting layer, which may include an emissive first dopant and a non-emissive second dopant, which may not be self-excited and may not contribute to light emission, energy may be smoothly transferred to the first dopant GD1.

In addition, the second dopant may limit an emission zone through transport of electrons in the green light-emitting layer. Therefore, accumulation of electrons at the interface with a neighboring electron transport layer may be prevented or reduced, the efficiency of the device may be improved, and the lifespan of the device may be lengthened.

The above-described features, structures, and effects of the present disclosure are included in at least one example embodiment of the present disclosure, but are not limited to only one example embodiment. Furthermore, the features, structures, and effects described in at least one example embodiment of the present disclosure may be implemented through combination with or modification of other embodiments by those skilled in the art. Therefore, content associated with the combination and modification should be construed as being within the scope of the present disclosure.

It will be apparent to those skilled in the art that various substitutions, modifications, and variations are possible within the scope of the present disclosure without departing from the spirit and scope of the disclosure. Therefore, it is intended that embodiments of the present disclosure cover the various substitutions, modifications, and variations of this disclosure, provided they come within the scope of the appended claims and their equivalents.

What is claimed is:

1. A white organic light-emitting device, comprising:
a first electrode;
a second electrode, the second electrode and the first electrode facing each other;
a blue light-emitting stack;
a phosphorescent light-emitting stack comprising
a hole transport layer;
a red light-emitting layer on the hole transport layer;
a green light-emitting layer on the red light-emitting layer, the green light-emitting layer comprising
a hole-transporting host;
an electron-transporting host;
a first dopant having a green emission peak; and
a non-emissive second dopant; and
an electron transport layer on the green light-emitting layer;
wherein the blue light-emitting stack and the phosphorescent light-emitting stack are between the first electrode and the second electrode; and
a charge generation layer between the blue light-emitting stack and the phosphorescent light-emitting stack,
wherein a highest occupied molecular orbital, HOMO, energy level of the second dopant is lower than a HOMO energy level of the electron-transporting host, and
wherein a lowest unoccupied molecular orbital, LUMO, energy level of the second dopant is higher than a LUMO energy level of the first dopant.

2. The white organic light-emitting device according to claim 1, wherein a difference, ΔEst, between a singlet energy level of the second dopant and a triplet energy level of the second dopant is 0.6 eV or more.

3. The white organic light-emitting device according to claim 1, wherein a singlet energy level of the second dopant is greater than a singlet energy level of each of the hole-transporting host, the electron-transporting host, and the first dopant, and
wherein the singlet energy level of each of the hole-transporting host and the electron-transporting host is 2.7 eV or more.

4. The white organic light-emitting device according to claim 3, wherein a triplet energy level of the second dopant is less than a triplet energy level of each of the hole-transporting host and the electron-transporting host, and is greater than a triplet energy level of the first dopant, and
wherein the triplet energy level of the first dopant is 2.4 eV or more.

5. The white organic light-emitting device according to claim 1, wherein the second dopant has a photoluminescence peak at a wavelength of 400 nm or less.

6. The white organic light-emitting device according to claim 1, wherein the second dopant has an energy band gap of 3 eV or more and a HOMO energy level of −6.0 eV or less.

7. The white organic light-emitting device according to claim 1, wherein an electron mobility of the second dopant is higher than a hole mobility of the second dopant.

8. The white organic light-emitting device according to claim 1, wherein the first dopant and the second dopant are present in the green light-emitting layer in a total amount of from 0.02 vol % to 30 vol %, based on a total volume of the hole-transporting host and the electron-transporting host, and wherein the second dopant is present in the green light-emitting layer in an amount of from 0.01 vol % to 20 vol %, based on the total volume of the hole-transporting host and the electron-transporting host.

9. The white organic light-emitting device according to claim 1, wherein the blue light-emitting stack includes a first blue light-emitting stack and a second blue light-emitting stack between the first electrode and the second electrode.

10. The white organic light-emitting device according to claim 9, wherein the first and second blue light-emitting stacks are disposed adjacent to the first electrode or the second electrode, or
wherein the phosphorescent light-emitting stack is disposed between the first blue light-emitting stack and the second blue light-emitting stack, a first charge generation layer is between the phosphorescent light-emitting stack and the first blue light-emitting stack, and a second charge generation layer is between the phosphorescent light-emitting stack and the second blue light-emitting stack.

11. The white organic light-emitting device according to claim 1, wherein the red light-emitting layer has an emission peak at a wavelength of from 600 nm to 640 nm, and
wherein the green light-emitting layer has an emission peak at a wavelength of from 500 nm to 540 nm.

12. The white organic light-emitting device according to claim 1, wherein the red light-emitting layer has an emission peak at a wavelength of from 600 nm to 640 nm, and
wherein the green light-emitting layer has an emission peak at a wavelength of from 540 nm to 580 nm.

13. A display device, comprising:
a substrate comprising a thin-film transistor at each of sub-pixels;
a first electrode connected to the thin-film transistor at each of the sub-pixels;
a second electrode over the sub-pixels and spaced apart from the first electrode;
a blue light-emitting stack;
a phosphorescent light-emitting stack comprising
a hole transport layer;
a red light-emitting layer on the hole transport layer; and
a green light-emitting layer on the red light-emitting layer, the green light-emitting layer comprising
a hole-transporting host;
an electron-transporting host;
a first dopant having a green emission peak; and
a non-emissive second dopant; and
an electron transport layer on the green light-emitting layer;
wherein the blue light-emitting stack and the phosphorescent light-emitting stack are between the first electrode and the second electrode; and
a charge generation layer between the blue light-emitting stack and the phosphorescent light-emitting stack,
wherein a highest occupied molecular orbital, HOMO, energy level of the second dopant is lower than a HOMO energy level of the electron-transporting host, and
wherein a lowest unoccupied molecular orbital, LUMO, energy level of the second dopant is higher than a LUMO energy level of the first dopant.

14. The display device according to claim 13, wherein a difference, ΔEst, between a singlet energy level of the second dopant and a triplet energy level of the second dopant is 0.6 eV or more.

15. The display device according to claim 13, wherein a singlet energy level of the second dopant is greater than a singlet energy level of each of the hole-transporting host, the electron-transporting host, and the first dopant, and
wherein the singlet energy level of each of the hole-transporting host and the electron-transporting host is 2.7 eV or more.

16. The display device according to claim 13, wherein a triplet energy level of the second dopant is less than a triplet energy level of each of the hole-transporting host and the electron-transporting host, and is greater than a triplet energy level of the first dopant, and
wherein the triplet energy level of the first dopant is 2.4 eV or more.

17. The display device according to claim 13, wherein the second dopant has a photoluminescence peak at a wavelength of 400 nm or less.

18. The display device according to claim 13, wherein the second dopant has an energy band gap of 3 eV or more and a HOMO energy level of −6.0 eV or less.

* * * * *